United States Patent
Rao et al.

(10) Patent No.: US 6,912,052 B2
(45) Date of Patent: Jun. 28, 2005

(54) GAS DISCHARGE MOPA LASER SPECTRAL ANALYSIS MODULE

(75) Inventors: Rajasekhar M Rao, San Diego, CA (US); John T. Melchior, San Diego, CA (US); Holger K. Glatzel, San Diego, CA (US)

(73) Assignee: Cymer, Inc., San Diego, CA (US)

( * ) Notice: Subject to any disclaimer, the term of this patent is extended or adjusted under 35 U.S.C. 154(b) by 7 days.

(21) Appl. No.: 10/676,175

(22) Filed: Sep. 30, 2003

(65) Prior Publication Data

US 2005/0046856 A1 Mar. 3, 2005

Related U.S. Application Data

(63) Continuation-in-part of application No. 10/173,190, filed on Jun. 14, 2002, now Pat. No. 6,750,972, which is a continuation-in-part of application No. 10/141,201, filed on May 7, 2002, now Pat. No. 6,839,372, and a continuation-in-part of application No. 10/000,991, filed on Nov. 14, 2001, now Pat. No. 6,795,474, and a continuation-in-part of application No. 09/854,097, filed on May 11, 2001, now Pat. No. 6,757,316, and a continuation-in-part of application No. 09/716,041, filed on Nov. 17, 2000, now Pat. No. 6,778,584.

(51) Int. Cl.$^7$ .............................. G01B 9/02; H01S 3/13
(52) U.S. Cl. ........................................ 356/451; 392/32
(58) Field of Search ................................ 356/450, 451; 372/32, 29.02

(56) References Cited

U.S. PATENT DOCUMENTS

| | | |
|---|---|---|
| 4,223,279 A | 9/1980 | Bradford, Jr. et al. |
| 4,455,658 A | 6/1984 | Sutter |
| 4,959,840 A | 9/1990 | Akins et al. |

(Continued)

*Primary Examiner*—Gregory J. Toatley, Jr.
*Assistant Examiner*—Patrick Connolly

(74) *Attorney, Agent, or Firm*—Cymer, Inc.; William C. Cray

(57) ABSTRACT

A wavemeter and method for measuring bandwidth for a high repetition rate gas discharge laser having an output laser bean comprising a pulsed output of greater than or equal to 15 mJ per pulse, sub-nanometer bandwidth tuning range pulses having a femptometer bandwidth precision and tens of femptometers bandwidth accuracy range, for measuring bandwidth on a pulse to pulse basis at pulse repetition rates of 4000Hz and above, is disclosed which may comprise a focusing lens having a focal length; an optical interferometer creating an interference fringe pattern; an optical detection means positioned at the focal length from the focusing lens; and a bandwidth calculator calculating bandwidth from the position of interference fringes in the interference fringe pattern incident on the optical detection means, defining a $D_{ID}$ and a $DO_{OD}$, the respective distances between a pair of first fringe borders and between a pair of second fringe borders in the interference pattern on an axis of the interference pattern, and according to the formula $\Delta\lambda = \lambda_0 [D_{OD}^2 - D_{ID}^2]/[8f^2 - D_0^2]$, where $\lambda_0$ is an assumed constant wavelength and $D_0 = (D_{OD} - D_{ID})/2$, and f is the focal length. The optical detector may be a photodiode array. The wavemember may have an optical interferometer having a slit function; the slit function and the focal length being selected to deliver to the optical detector the two innermost fringes of the optical interference ring pattern. The optical detector may comprise an array of pixels each having a height and width and the array having a total width; and an aperture at the optical input to the optical interferometer may selectively input to the optical interferometer a portion of a beam of light sufficient for the output of the etalon to illuminate the optical detector over the height of each respective pixel height and the total width. The optical interferometer may comprise an etalon having a slit function of 3 pm or less and a finesses of 25 or greater; and the focal length may be 1.5 meters. A second stage diffuser may be placed between the first stage diffuser and the etalon delivering a narrow cone of light to the etalon, and an aperture between the second stage diffuser and the etalon may deliver to the etalon a thin strip of the narrow cone of light.

152 Claims, 12 Drawing Sheets

U.S. PATENT DOCUMENTS

| | | | |
|---|---|---|---|
| 5,023,884 A | | 6/1991 | Akins et al. |
| 5,025,445 A | | 6/1991 | Anderson et al. |
| 5,025,446 A | | 6/1991 | Kuizenga |
| 5,189,678 A | | 2/1993 | Ball et al. |
| 5,313,481 A | | 5/1994 | Cook et al. |
| 5,315,611 A | | 5/1994 | Ball et al. |
| 5,359,620 A | | 10/1994 | Akins |
| 5,448,580 A | | 9/1995 | Birx et al. |
| 5,471,965 A | | 12/1995 | Kapich |
| 5,852,621 A | | 12/1998 | Sandstrom |
| 5,863,017 A | | 1/1999 | Larson et al. |
| 5,953,360 A | | 9/1999 | Vitruk et al. |
| 5,978,394 A | | 11/1999 | Newman et al. |
| 5,991,324 A | * | 11/1999 | Knowles et al. ............... 372/57 |
| 6,005,879 A | | 12/1999 | Sandstrom et al. |
| 6,016,325 A | | 1/2000 | Ness et al. |
| 6,018,537 A | | 1/2000 | Hofmann et al. |
| 6,028,880 A | | 2/2000 | Carlesi et al. |
| 6,067,311 A | | 5/2000 | Morton et al. |
| 6,094,448 A | | 7/2000 | Fomenkov et al. |
| 6,104,735 A | | 8/2000 | Webb |
| 6,128,323 A | | 10/2000 | Myers et al. |
| 6,151,349 A | | 11/2000 | Gong et al. |
| 6,164,116 A | | 12/2000 | Rice et al. |
| 6,192,064 B1 | | 2/2001 | Algots et al. |
| 6,208,674 B1 | | 3/2001 | Webb et al. |
| 6,208,675 B1 | | 3/2001 | Webb |
| 6,219,368 B1 | | 4/2001 | Govorkov |
| 6,240,117 B1 | | 5/2001 | Gong et al. |
| 6,317,448 B1 | * | 11/2001 | Das et al. ..................... 372/60 |
| 6,330,261 B1 | | 12/2001 | Ishihara et al. |
| 6,414,979 B2 | | 7/2002 | Ujazdowski et al. |
| 6,477,193 B2 | | 11/2002 | Oliver et al. |
| 6,539,046 B2 | * | 3/2003 | Newman et al. ............... 372/98 |
| 6,625,191 B2 | | 9/2003 | Knowles et al. |
| 6,690,704 B2 | | 2/2004 | Fallon et al. |
| 6,693,939 B2 | | 2/2004 | Klene et al. |
| 6,757,316 B2 | * | 6/2004 | Newman et al. ............... 372/57 |
| 2002/0006149 A1 | | 1/2002 | Spangler et al. |
| 2002/0048288 A1 | | 4/2002 | Kroyan et al. |
| 2002/0101589 A1 | | 8/2002 | Sandstrom et al. |
| 2002/0154668 A1 | | 10/2002 | Knowles et al. |
| 2002/0154671 A1 | | 10/2002 | Knowles et al. |
| 2003/0012234 A1 | | 1/2003 | Watson et al. |
| 2003/0018072 A1 | | 1/2003 | Whittak et al. |
| 2003/0099269 A1 | | 5/2003 | Ershov et al. |
| 2003/0138019 A1 | | 7/2003 | Rylov et al. |

* cited by examiner

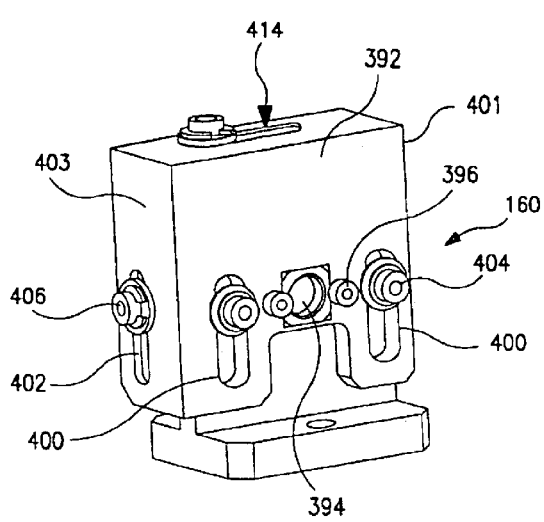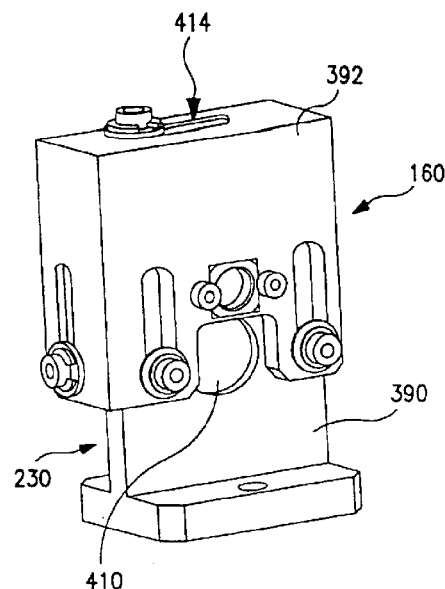
FIG. 13a     FIG. 13b
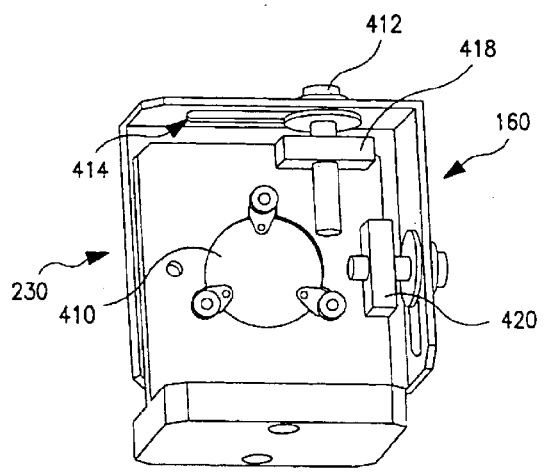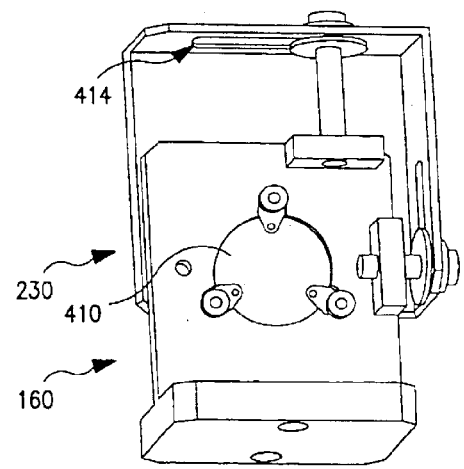
FIG. 13c     FIG. 13d

GAS DISCHARGE MOPA LASER SPECTRAL ANALYSIS MODULE

RELATED APPLICATIONS

This application is a continuation-in-part of U.S. patent application Ser. No. 10/173,190, filed Jun. 14, 2002, now U.S. Pat. No. 6,750,972, which is a continuation-in-part of Ser. No. 10/141,201 filed May 7, 2002 now U.S. Pat. No. 6,839,372, Ser. No. 10/000,991 filed Nov. 14, 2001 now U.S. Pat. No. 6,795,474, Ser. No. 09/716,041, filed Nov. 17, 2000 now U.S. Pat. No. 6,778,584, Ser. No. 09/854,097, filed May 11, 2001 now U.S. Pat. No. 6,757,316, and is related to application Ser. No. 10/676,224 entitled "Optical Mountings for MOPA Laser Wavemeter" and application Ser. No. 10/676,907 entitled "Gas Discharge MOPA Laser Spectral Analysis Module", both filed on the same day as this Application, the disclosures of which are hereby incorporated by reference.

FIELD OF THE INVENTION

The present invention relates to very high repetition rate gas discharge lasers in a MOPA configuration producing pulses of laser light at four to eight thousand pulses per second or above with very finely controlled wavelength and bandwidth on a pulse to pulse basis, and at output power levels up to and exceeding 30 mJ.

BACKGROUND OF THE INVENTION

U.S. Pat. No. 6,317,448, issued to Das, et al. on Nov. 13, 2001, titled BANDWIDTH ESTIMATING TECHNIQUE FOR NARROW BAND LASER, based upon an application Ser. No. 09/405,615, filed on Sep. 23, 1999, and U.S. patent applications Ser. Nos. 10/012,002, filed on Nov. 30, 2001, entitled VERY NARROW BAND TWO CHAMBER HIGH REPETITION RATE GAS DISCHARGE LASER SYSTEM, with inventors, Knowles, et al., published on Oct. 24, 2002, Pub. No. 20020154668, and 10/026,676, filed on Dec. 21, 2001, entitled FOUR KHZ GAS DISCHARGE LASER SYSTEM, with inventors Wittak et al., published on Jun. 26, 2003, Pub. No. 20030018072, and 10/056,619, filed on Jan. 23, 2002, entitled LINE SELECTED $F_2$ CHAMBER LASER SYSTEM, with inventors Knowles, et al., published on Oct. 24, 2002, Pub. No. 2002/0154671, and Ser. No. 10/141,216, filed on May 7, 2002, entitled LASER LITHOGRAPHY LIGHT SOURCE WITH BEAM DELIVERY, with inventors Klene, et al., published on Dec. 19, 2002, Pub. No. 20020191654, and Ser. No. 10/187,336, filed on Jun. 28, 2002, entitled SIX TO TEN KHZ, OR GREATER GAS DISCHARGE LASER SYSTEM, with inventors Watons, et al., published on Jan. 16, 2003, Pub. No. 20030012234, and Ser. No. 10/243,102, filed on Sep. 13, 2002, entitled TWO CHAMBER $F_2$ LASER SYSTEM WITH $F_2$ PRESSURE BASED LINE SELECTION, with invention Rylov et al., published on Jul. 24, 2003, Pub. No. 20030138019, and Ser. No. 10/210,761, filed on Jul. 31, 2002, entitled CONTROL SYSTEM FOR A TWO CHAMBER GAS DISCHARGE LASER, with inventors Fallon, et al., published on Feb. 13, 2003, Pub. No. 20030031216, and Ser. No. 10/036,727, filed on Dec. 21, 2001, entitled TIMING CONTROL FOR TWO-CHAMBER GAS DISCHARGE LASER SYSTEM, with inventors Ershov et al., published on May 29, 2003, Pub. No. 20030099269, while, except for the referenced patent, not prior art to the present application discuss existing gas discharge lasers and wavemeters and other metrology devices used with such lasers. The above referenced patent and applications are all assigned to the assignee of the present application and the disclosure of each of which is hereby incorporated by reference.

There exists a need for improved metrology equipment for gas discharge lasers operating at the repetition rates discussed in the above referenced applications and beyond those rates and especially for such lasers configured in a MOPA system with the higher power outputs available.

SUMMARY OF THE INVENTION

A wavemeter and method for measuring bandwidth for a high repetition rate gas discharge laser having an output laser beam comprising a pulsed output of greater than or equal to 15 ml per pulse, sub-nanometer bandwidth tuning range pulses having a femtometer bandwidth precision and tens of femtometers bandwidth accuracy range, for measuring bandwidth on a pulse to pulse basis at pulse repetition rates of 4000Hz and above, is disclosed which may comprise a focusing lens having a focal length; an optical interferometer creating an interference fringe pattern; and optical detection means positioned at the focal length from the focusing lens; and a bandwidth calculator calculating bandwidth from the position of interference fringes in the interference fringe pattern incident on the optical detection means, defining a $D_{ID}$ and a $D_{OD}$, the respective distances between a pair of first fringe borders and between a pair of second fringe borders in the interference pattern on an axis of the interference pattern, and according to the formula $\Delta\lambda = \lambda_0 [D_{OD}^2 - D_{ID}^2]/[8f^2 - D_0^2]$, where $\lambda_0$ is an assumed constant wavelength and $D_0 = (D_{OD} - D_{ID})/2$, and f is the focal length. The optical detector may be a photodiode array. The wavemember may have an optical interferometer having a slit function; the slit function and the focal length being selected to deliver to the optical detector the two innermost fringes of the optical interference ring pattern. The optical detector may comprise an array of pixels each having a height and width and the array having a total width; and an aperture at the optical input to the optical interferometer may selectively input to the optical interferometer a portion of a beam of light sufficient for the output of the etalon to illuminate the optical detector over the height of each respective pixel height and the total width. The optical interferometer may comprise an etalon having a slit function of 3 pm or less and a finesses of 25 or greater; and the focal length may be 1.5 meters. A second stage diffuser may be placed between the first stage diffuser and the etalon delivering a narrow cone of light to the etalon, and an aperture between the second stage diffuser and the etalon may deliver to the etalon a thin strip of the narrow cone of light.

BRIEF DESCRIPTION OF THE DRAWINGS

FIGS. 13a–d show a slit assembly according to an embodiment of the present invention.

DETAILED DESCRIPTION OF PREFERRED EMBODIMENTS

Figure 1:
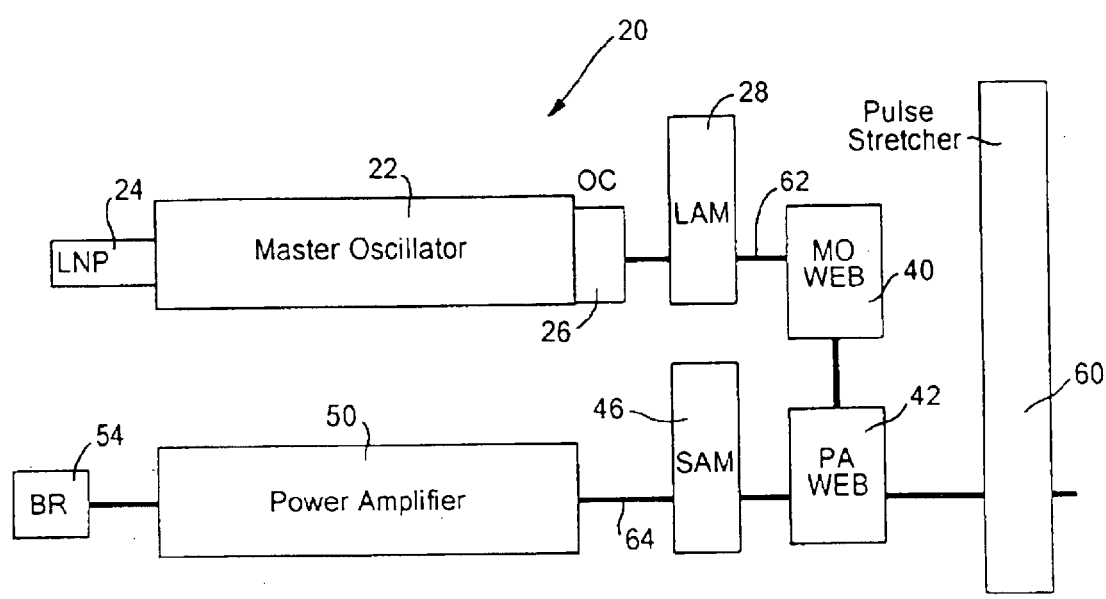
FIG. 1 shows MOPA configured gas discharge laser which may employ an embodiment of the present invention.

This application relates to satisfying the requirements for a spectral analysis module ("SAM") metrology subsystem for a MOPA two chamber laser producing laser output pulses at over 4000 Hz and at up to and exceeding 30 mJ of pulse energy and also controlling wavelength and bandwidth on a pulse to pulse basis. Those skilled in the art will appreciate the extreme demands placed on such a MOPA laser subsystem and its function, including many of the sub-modules required and their functionality, in order to satisfy the performance requirements of such a MOPA laser. The present invention is explained for purposes of illustration only with respect to an ArF MOPA laser operating at a nominal 193.350 nm wavelength, but can be applied as well, e.g., for a KrF or an $F_2$ MOPA gas discharge laser system just as well.

The following acronyms used in this application shall have the following meanings:

| Term/Acronym | Definition |
|---|---|
| ABF | Ammonium BiFluoride |
| ADC | Analog to digital converter |
| Amp | Amperes of current |
| AOI | Angle of Incidence |
| ArF | Argon Fluoride |
| AR | Anti-Reflection (a coating to reduce Fresnel reflection from an optical surface) |
| AWR | Absolute Wavelength Reference |
| BARO | Barometric station for alignment, calibration and test of modules |
| Blur | Compensation factor used to compensate for "bandwidth saw-tooth" effect |
| BW | Bandwidth |
| $CaF_2$ | Calcium Fluoride |
| DD | Diffractive Diffuser |
| DFM | Design for Manufacturing |
| EWCM | Enhanced Wavelength Control Module |
| $F_2$ | Fluorine |
| FCP | Fire Control Processor |
| FD | Focal distance |
| fm | femtometer |
| FRU | Field Replacement Units |
| FS | Fused Silica |

-continued

| Term/Acronym | Definition |
|---|---|
| FSR | Free Spectral Range |
| FWHM | Full Width at Half Maximum. A common metric for laser bandwidth. |
| GGD | Ground Glass Diffuser |
| KrF | Krypton Fluoride |
| LAM | Line center Analysis Module |
| LNM/LNP | Line Narrowing Module/Line Narrowing Package |
| $MgF_2$ | Magnesium Fluoride |
| MOPA | Master Oscillator Power Amplifier |
| NIST | National Institute of Standards and Technology |
| PDA | Photodiode Array |
| PDM | Photodetector Module |
| pm | picometer |
| SAM | Spectral Analysis Module |
| WEB | Wavefront Engineering Box |

The metrology subsystem of a MOPA laser system as described above, including a SAM, can, e.g., perform crucial functions, e.g., measuring the wavelength, bandwidth and pulse energy of the light output from the MOPA. The overall MOPA system 20 can be seen in viewing FIG. 1. These performance characteristics of the laser system 20 can be critical, e.g., to controlling lithography processes, often the end use for laser light produced by such laser light systems 20. The requirements for lithography processes in terms of, e.g., pulse by pulse control of, and even finely controlled modification of, wavelength, bandwidth, pulse energy, pulses per burst of pulses, etc. create significant demands on any control system for such a laser system 20, and the metrology portion of the control system is similarly put to demands for performance efficacies and efficiencies not seen in the industry even as few as one or two years ago, and they are getting even more demanding.

The MOPA configuration, as seen in FIG. 1 has facilitated much smaller bandwidth than, e.g., applicants' assignee's previous generation laser products, e.g., the Cymer 70XXX series of, e.g., KrF and ArF lasers. Consequently, as an example, the currently required bandwidth is beyond the tracking capability of, e.g., a 7000A wavemeter and the architecture has required the function to be split off to a separate module, the SAM. In a MOPA laser system 20 as seen in FIG. 1 a first laser chamber 22, the master oscillator ("MO"), is very finely tuned, utilizing, e.g., a line narrowing package ("LNF") 24, including, e.g., a diffractive optic, e.g., a grating (not shown) to produce an output after some resonance in the MO chamber, through an output coupler 26, of a seed laser beam 62 with a very narrow bandwidth centered about a wavelength that is at or almost at the nominal 193.350 nm wavelength. The MO output beam 62 is then sent through an MO waveform engineering box ("WEB") 40, as noted in the above referenced co-pending applications assigned to applicants' assignee. The beam is then passed to a power amplifier WEB 42 and from there to a SAM 46, where among other things, the MO beam is mostly directed into the power amplifier ("PA") portion 50 of the MOPA laser system 20. In the PA portion 50, the seed MO beam at or very near the desired wavelength and bandwidth is amplified in the PA 50, by at least two passes through the gain medium which forms the PA 50 with the aid of a beam reflector BR 54.

The output beam 64 of the PA portion 50 of the system 20 then passes back through the SAM 46 and the PA WEB 42 and into a pulse stretcher 60, where each of the output pulses of the beam 64 is stretched, e.g., in an optical delay unit to, e.g., improve the $T_{IS}$. This impacts such things as the dose seen at the wafer in a lithography exposure of, e.g., photoresist on a wafer, and also certain other characteristics of the performance of a stepper/scanner lithography tool in performing, e.g., the noted exposure.

Figure 2:
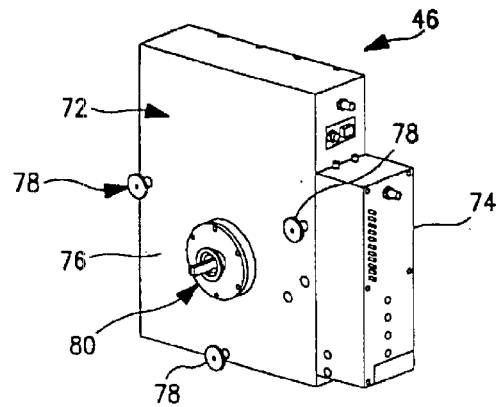
FIG. 2 shows a perspective view of a spectral analysis module according to an embodiment of the present invention.

The SAM, 46, as seen in FIG. 2, can be sub-divided into an opto-mechanical part 72, e.g., for performing the function of a bandwidth ("BW") meter, and an electronics portion 74, e.g., containing the logic assembly part. The fundamental optical aspects of the SAM are similar to wavemeters used in the past, e.g., in applicants' assignee's 70XX products, i.e., the LAM, with a number of critical variations which form, in part, an embodiment of the present invention. The bandwidth-meter optical layout involves, among other things, using a shorter FSR etalon with a longer focal length imaging lens, as explained in more detail below, requiring, e.g., beam homogenization in the first leg of the etalon optical circuit. Like the wavemember in, e.g., a 70xx LAM, a photodetector module (PDM) 144 monitors the pulse energy, and provides a fast photodiode signal for diagnostic and timing purposes.

The SAM 46 is contained within a SAM enclosure 76 which is attached to an optical mounting floor (shown in FIG. 4) by a plurality of thumb screws 78. The view of the SAM enclosure 76 shown in FIG. 2 shows a primary beam splitter 80, which is receiving the beam 64 from the PA 50 on the side of the SAM enclosure 76 shown in FIG. 2, which passes through the primary beam splitter 80 and the beam 64 after passing partially through the primary beam splitter 80 exits the rear of the SAM enclosure 76 as seen in FIG. 2 and back into the PA WEB 42, as shown in FIG. 1.

Figure 3A:
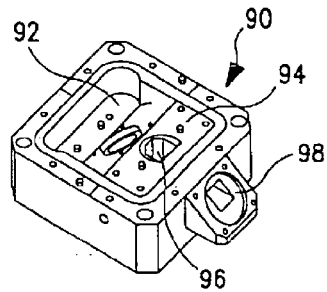
FIGS. 3a–c components of a primary beam splitter according to an embodiment of the present invention.
Figure 3B:
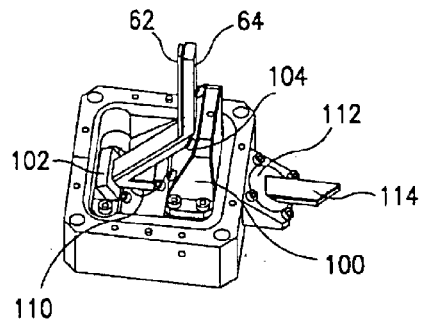
Figure 3C:
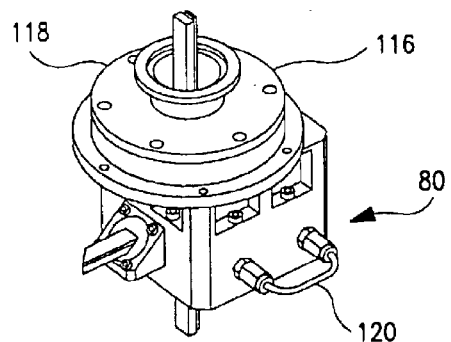

As illustrated in FIGS. 3a–c, the primary beam splitter 80 may comprise a beam splitter purge cell base 90, which may be, e.g., machined out of a solid piece of aluminum, to form within the interior of the purge cell base 90 a steering mirror mounting shelf 92 and a primary beam splitter mirror mounting platform 94. The platform 94 and the bottom of the cell base 90 may have formed therein a beam passage opening 96. The base 90 may also have formed in one sidewall thereof a sample beam exit opening 98. As can be seen from FIG. 3b, the sample beam opening 98 may be covered by a sample beam exit window 112, through which the sample beam 114 exist the primary beam splitter 80 into the remainder of the optical and electronic elements of the SAM 46. The opposite end of the sample beam passage 98, within the interior of the base 90 may also be covered by a window 110, through which a portion of the beam 64, reflects from a steering mirror 102, mounted on the steering mirror shelf 92, and into the sample beam passage 98.

FIG. 3b also illustrates the primary beam splitter mirror 104 mounted on a primary beam splitter mirror mount 100. It will be understood that in operation, the beam 64 exiting the PA 50 will enter the primary beam splitter 80 from above along the vertical axis shown in FIG. 3b, which is also the propagation axis of the beam 64 from the PA 50, normally in the horizontal plane. The beam 64 is partially reflected by the primary beam splitter mirror 104, and approximately 5% of the beam 64 is reflected onto the steering mirror 102, while the remainder passes through the primary beam splitter mirror 104 and on to the PA WEB 42, as shown in FIG. 1.

The approximately 5% of the beam reflected from the primary beam splitter mirror 104 is reflected from the steering mirror 102 at an angle of incidence of about 25° and exits the primary splitter 80 through window 112 as sample beam 114, and into the remainder of the SAM 46 as explained in more detail below. It will also be understood that the beam 62 from the MO 22, enters into the PA 50 from the PA WEB 42 through the same primary beam splitter mirror 104 in the opposite direction, i.e., toward the PA 50 as part of the seeding of the PA 50 gain medium with the MO beam 62.

FIG. 3c shows the primary beam splitter 80 with a beam splitter cover 116, including a flange 118 for connection to the purge system bellows of the PA 50, as further explained, e.g., in the above referenced co-pending applications.

Figure 4:
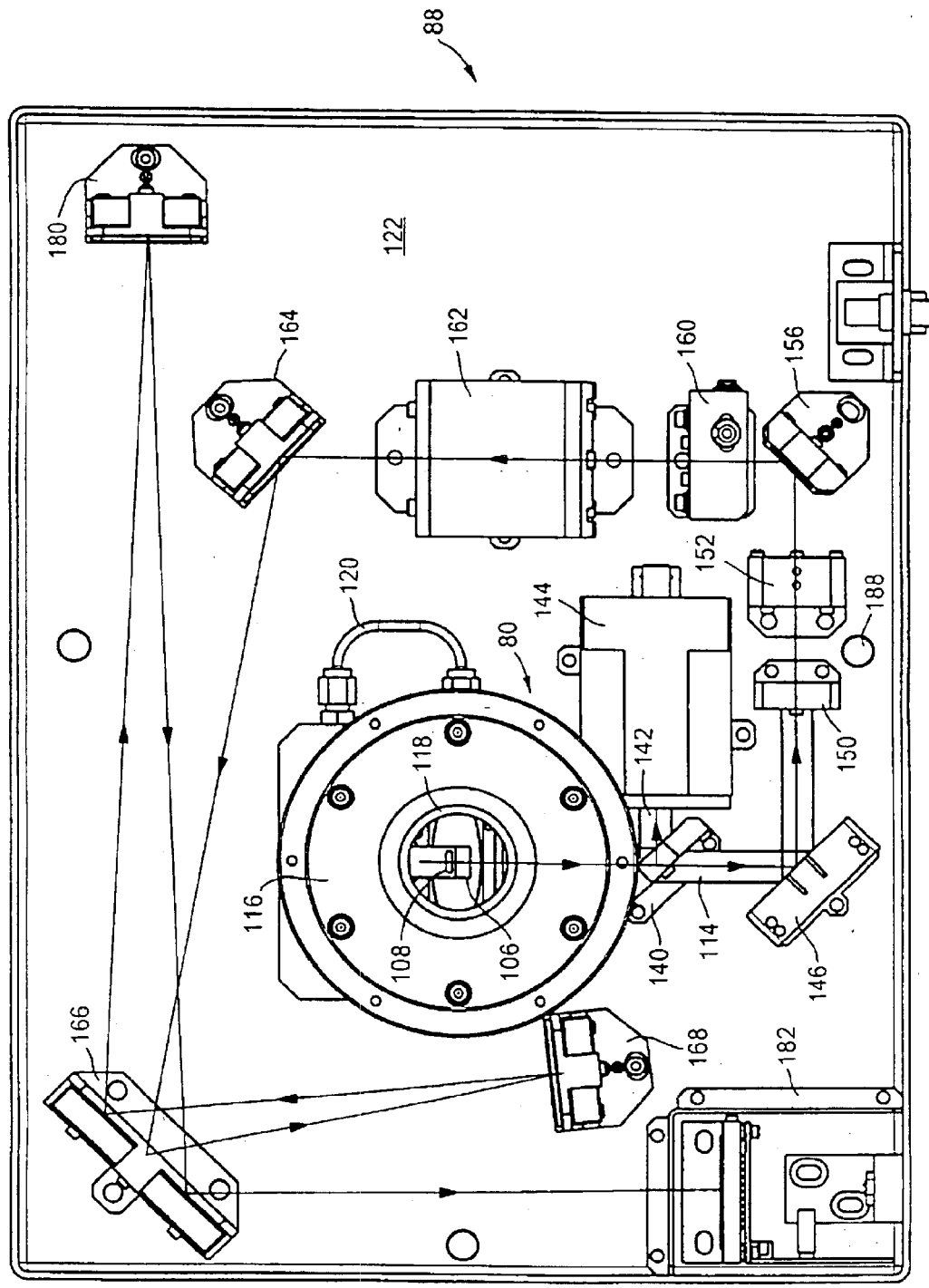
FIG. 4 shows a plan view of a spectral analysis module according to an embodiment of the present invention.

As shown in FIG. 4, a plan view of the SAM optics subsystem 72, light that is picked off from the main beam 64 by a primary beam splitter mirror 104 and reflected from the steering mirror 102 exiting the primary beam splitter 80 as sampled beam 114. The sampled beam 114 has the Fresnel reflections off the front and rear surfaces of an uncoated optic of a secondary beam splitter 104 distributed within the bandwidth meter 88 of the SAM 46 to feed two separate internal functions of the bandwidth meter 88 of the SAM 46. Part of the beam 114 incident on the secondary beam splitter mirror 140 is reflected onto photodetector module ("PDM") 144 as beam 142 for pulse energy measurement, and output to the electronics package 74 as a fast photodiode signal. The bandwidth circuit, explained in more detail below receives the principal portion of the beam 114 from the steering mirror passing through the mirror 140 acting as the secondary beam splitter. Due to the thinness of the selected primary beam splitter mirror 104, the Fresnel reflections are overlapping, complicating the problem of keeping the fluences on certain optics in the SAM within tolerances, i.e., below the damage threshold for the material of the optic. This beam 114 is involved in illuminating an etalon 162, as explained in more detail below, which produces a fringe pattern that is monitored using a photodiode array PDA 12. From the fringe pattern the FWHM bandwidth can be calculated, according to an embodiment of the present invention, to under 0.01 pm precision, using simplified mathematical calculations that increase the speed of processing the output of the PDA 182 to better allow for pulse-wise computations at 4000Hz and above.

The SAM 46 can measure the bandwidth with the output of the PDA 182 and the pulse energy at the output of the PDM 144. The SAM 46 & LAM 28 can interface to the laser control system (not shown), which subsequently provides the active control, based upon the feedback from, among other things, these metrology modules.

Figure 7:
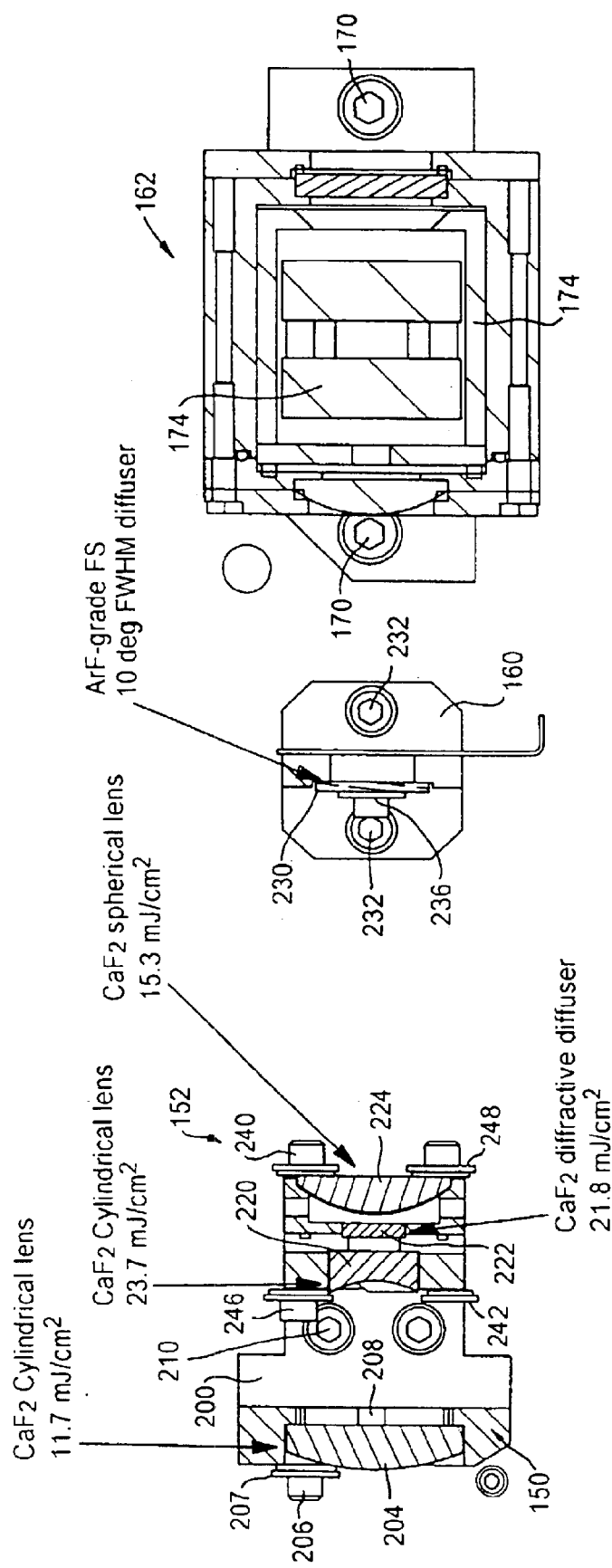
FIG. 7 shows a plan view of elements shown in FIG. 4 in further detail according to an embodiment of the present invention.

As shown in FIG. 4, the beam 114 extending the secondary beam splitter 140 is incident on an adjustable M1 mirror 146 and directed into a front cylindrical telescoping lens 204 contained within a lens mounting 150 and then into an optics combination unit 152, which as explained in more detail with respect to FIG. 7, includes, in order, a rear telescoping lens 220, a first stage diffuser 222 and a focusing lens 224. The beam 114 then passes through a second stage diffuser 160 after being reflected off of an adjustable M2 mirror 156. The beam then passes through an etalon 162. The fringe pattern created by passing the beam through the etalon 162 is reflected off of an adjustable M3 mirror 164, and onto generally the center of an elongated M4 fixed 45° training mirror 166, and onto the face of an adjustable M5 normal incidence mirror 168. The fringe pattern is then reflected back off of the right-hand portion of the mirror 166 and off of another adjustable M6 normal incidence mirror 180 and back onto the left-hand portion of the mirror 166 and finally is incident of the PDA 182. Except for M1 146 the mirrors, though adjustable in some sense, e.g., during installation, are not field accessible for adjustments, whereas M1 146 is field adjustable.

The function of the SAM 46 according to an embodiment of the present invention is to provide a high-resolution measure of, e.g., bandwidth, e.g., the FWHM bandwidth of the laser output beam 64 at the PA 50. As a consequence of positioning the SAM 46 at the output of the PA 50, the energy density levels seen by the optical elements within the SAM 46 can be very significantly higher than, e.g., the corresponding elements, e.g., in the LAM 28 and/or in prior lasers, e.g., applicant's assignee's 70XX products. This can, e.g., significantly increase the lifetime risk, e.g., to the primary beam splitter 80 and a number of other optical components within the SAM 46. In order to mitigate fluence driven damage, e.g., to the primary beam splitter 80, the SAM module 46 has been designed, according to an embodiment of the present invention, with the primary splitter mirror 104 oriented, e.g., at 70 degrees to the beams 62 from the MO 22 and 64 from the PA 50. This has been chosen to thereby reduce the fluence levels (per $cm^2$) by a factor of two as compared, e.g., to a beam splitter oriented at 45 degrees. Calcium fluoride has also been selected as the optical material of choice for selected ones of the optics, e.g., in the beam homogeneization scheme within the SAM 46 according to an embodiment of the present invention.

The required operating parameters for the SAM according to an embodiment of the present invention include a wavelength wavelength operating range of between 193.2 to 193.5 nm, such that the SAM module 46 will function out to either end of the wavelength range, a laser pulse repetition rate of 1 Hz to 4000 Hz, with the module 46 capable of measuring bandwidth on a pulsewise (shot by shot) basis, and a pulse energy exiting the PA 50 of 10 mJ to 30 mJ, the module providing bandwidth measurements over the range of pulse energies. In addition bandwidth ($\Delta\lambda$) resolution is required to be 0.001 pm precision required of the bandwidth calculation, bandwidth ($\Delta\lambda$) accuracy of ±0.04 pm, is required measured against the spectrometer (e.g., an LTB) used for calibrating the SAM module, and bandwidth measurement range is required to be $0.1\ pm \leq \Delta\lambda \leq 0.3\ pm$, FWHM metrology, requiring that the SAM module 46 be able to track the bandwidth over the range: $0.1\ pm \leq \Delta\lambda \leq 0.3$ pm, blur compensation precision is required to be $\leq 0.02$ pm BW difference between innermost and outermost fringe positions, (comparison of 2 averages: BW readings at 3 points, 0.02 pm apart within 0.03 pm of either side of the fringe jump zone; and Bandwidth Accuracy vs. Fringe Position is required to be $\leq \pm 0:02$ pm delta from the reference (e.g., LTB) spectrometer, as well as the capability to scan through one full FSR (3 pm) at 0.02 pm increments starting at the central wavelenth to compare BW against deconvolved spectrometer values.

With regard to power and pulse energy measurement for the specified pulse energy range of 10 mJ to 20 mJ (15 mJ nominal) the system must meet all optical specifications; energy monitor 144 calibration accuracy is required to be <±3% (at nominal 15 mJ, 1000 Hz continuous operation), with calibration based on NIST traceable commercial power meters with 0.05 watt resolution; energy monitor calibration drift must be >±2% peak to peak variation over 100 million pulses, as measured with a commercial power meter over the nominal shots of a laser gas test, with 0.05 watt resolution, and power linearity, at 1000 Hz continuous, all within ±1 watt, 10 mJ is 10 watts, 15 mJ is 15 watts, 20 mJ is 20 watts, as measured with water-cooled power meter heads. Implied linearity specification for constant energy and variable repetition rate need not apply.

Etalon starting raw video levels (both left and right peaks) are required to be 1.0 volts max, 0.6 volts min, as measured in a laser frame, according to an embodiment of the present invention, meeting BW specification operating at 15 mJ at the PA 50 output. Voltage levels being defined as raw peak minus floor. Fringe symmetry is required to be $155 \leq$ fringe symmetry $\leq 85$, and fringe symmetry=100×(left peak/right peak). End-of-life etalon 162 raw video levels (both left and right peaks), must meet the requirements of A) 2.5 volts max B) 0.3 volts min, as measured in a laser frame, according to an embodiment of the present invention, meeting BW specification and operating at 15 mJ at the PA 50 output. Energy monitor 144 signal level at 15 mJ pulse energy must be 15 K ADC max and 5 K ADC min.

According to an embodiment of the present invention, certain reliability specifications are required to be met, including, e.g., target mean time between failures of, e.g., $\geq 12$ B pulses; target mean time to replace, e.g., $\leq 2$ hours, with field replacement of SAM logic assembly; 15 minutes; field replacement of damaged primary splitter: 60 minutes including re-calibration of energy monitor; check etalon fringe pattern to correct possible low video or fringe asymmetry: 10 minutes; and equipment dependent uptime of $\geq 95\%$.

Maintenance requirements include, e.g., logic assembly 74 replacement requiring access to unit 74 while in the laser frame; primary beam splitter 80 replacement, with access to main splitter 80 through the removable clamp assembly (not shown) connected to the flange 118. Requires removal of the module from the laser frame; and adjustment of etalon 162 fringe symmetry and height, through two separate module cover holes to access 5/64 inch hex head adjustment screws 170 (shown in FIG. 7) during laser operation. A gas panel is hole required when this maintenance is done in the field.

In addition, according to an embodiment of the present invention the design requires that for the SAM module 46, exchange of the module 46 and calibration energy of energy measurement by the PDM 144 be completable in, e.g., two hours at a frequency of, e.g., 12 billion pulses, and the PDM 144 be calibrated once per year, also taking 2 hours.

The design of the SAM 46 is required to enable quick access to facilitate rapid removal of the module 46 from the system 20. This includes precluding improper mounting and installation in the superstructure. Guides, tracks, or stops may be provided as necessary to facilitate handling and prevent damage to equipment or injury to personnel.

The SAM 46, according to an embodiment of the present invention, will be required to measure, e.g., bandwidth to an accuracy of, e.g., at least 10 femptometers on a pulse by pulse basis at over 4000Hz and even up to 8000 Hz. With, e.g., a focal length of the imaging lens 224 shown in FIG. 7, and a free spectral range ("FSR") of the etalon 162 of 3 pm along with a pixel size in the PDA 182 of 0.025 mm horizontal by 0.5 mm vertical and PDA 182 with an array of 1024 photodiodes (pixels), one can use using the fundamental interferometer equation that deals with the intensity distribution of the etalon fringes, e.g., $\lambda=(2*n*d/m)*\text{Cos}(\theta)$, where $\lambda$ is the wavelength, nominally 193.350 nm, n is the internal index of refraction of the etalon, d is the etalon mirror spacing, m is the order, the integral number of wavelengths at the fringe peak and $\theta$ is the angle of incidence of the light path to the interferometer axis inside the etalon. The above can be rewritten as $\lambda=(2*n*d/m)*\text{Cos}(R/f)$, where R is the fringe radius, e.g., 250 to 450 PDA pixels, each pixel being approximately 25 $\mu$m, and f is the focal distance from the lens to the PDA plane of incidence, e.g., 61820 pixel widths, i.e., 1.532 m/25 $\mu$m, in the focal length of the focusing lens 224, nominally a 1.5 m focal length lens.

In order to deal with, e.g., mechanical drift in the beam pointing following the introduction of the interference within the etalon 162, it is preferable to deal with fringe diameters, D, rather than radii. Therefore, $\lambda=(2*n*d/m)\cos D/2f$. since the fringe widths are a measure of bandwidth of the light source passed through the etalon 162, with the assumption that the center wavelength is a known, the difference in the wavelengths calculated for the inner and outer diameters will give the raw bandwidth value. Assuming two peaks in the same ring, seen by the PDA 182 only as two separated peaks along an axis of the ring, $\lambda_{ID}$ (inner diameter)$=(2*n*d/m)*\cos(D_{ID}/2f)$ and $\lambda_{OD}$ (outer diameter)$=(2*n*d/m)*\cos(D_{OD}/2f)$. Since $\Delta\lambda=\lambda_{ID}-\lambda_{OD}$, $\Delta\lambda=\lambda_0[\cos(D_{ID}/2f)-\cos(D_{OD}/2f)]/\cos(D_0/2f)$, where $D_0=(D_{ID}+D_{OD})/2$, and $\lambda_0$ is the line center bandwidth related to $D_0$ by $\lambda=(2*n*d/m)* \cos(D_0/2f)$. In these equations, a guess at the $\lambda_0$ is sufficient in the embodiment of the present invention as long as the actual $\lambda_0$ is within 0.5 nm of the guess (assumption), and consequently neither an input from the LAM 28 or the utilization of a portion of the pixels in the PDA 182 for a course measurement of $\lambda_0$ is needed. The previously determined bandwidth may be utilized as a calibration value, however.

In order to preserve critical processor time, therefore, the above equations along with the small angle approximation results in the equation $\Delta\lambda=\lambda_0 [D_{OD}^2-D_{ID}^2]/[8f^2-D_0^2]$. The resulting error in using this equation over the prior art approach over the range of the detector is negligible, i.e., $<10^{-5}$ fm. The small angle error is essentially 0 over pixels from about 200 to 800 and increases roughly linearly from those points to the ends of the detector to about 0.0005 fm.

Treating $\lambda_0$ as a constant value of e.g., 193.350 nm, the bandwidth calculation, for a range of from about 193.200 to 193.500, i.e., about 0.3 nm, the error in bandwidth will remain within less than 0.1 fm. $D_{OD}$ will equal, e.g., 325 pixels and $D_{ID}$ will equal, e.g., 300 pixels, with $D_0$ then equal to 312.5 pixels, with f=61280 pixels widths as explained above.

Utilizing propagation of errors typically used for error analysis, assuming independent variables and covariant terms are eliminated and ignoring the contribution to error from varying gain/quantum efficiency/response between pixels in the PDA 182, the error $\sigma_0$ is $<8\times10^{-4}$ resulting from assuming a constant $\lambda_0$ over the laser's tunable range. For a comparable or lower contribution to the bandwidth error from the focal distance $\sigma_f$ would have to be less than 24 pixels (i.e., about 0.5 mm). Similarly, for a comparable or lower contribution to the error in bandwidth from the fringe diameter measurement, $\sigma_D$ would have to be better than $\frac{1}{73}^{rd}$ of a pixel. This verifies applicants' selection of the contributions based upon focal length distance errors and the fringe diameter measurements to optimize the calculation of the bandwidth, i.e., by assuming $\lambda_0$ to be a known constant.

Fluence levels at the first stage diffusers 222, according to an embodiment of the present invention, have been further contained by using a cylindrical lens telescope that, e.g., de-magnifies and collimates along the long axis of the beam 114 passing through the first stage diffuser 222, as opposed to using a spherical lens. The resulting decrease in energy densities has dramatically reduced the changes of damage to all the optics within the SAM 46, except perhaps for the primary beam splitter mirror 104, where fluence levels could reach almost 25 mJ/cm$^2$, e.g., when operating at 40 mJ output from the PA chamber 50. The energy density level at the primary splitter mirror 104 is closely tied to a number of system parameters and the ability to alleviate the problem purely from the design of the SAM module 46 design is limited.

In order to be able to measure bandwidths down to 0.2 pm and lower, the bandwidth tracking capability of the currently used wavemeters, e.g., those in applicants' assignee's 7000A laser products is inadequate. The slit function of the 20 pm FSR etalons used in a standard wavemeter make it difficult to track bandwidth variations in a reasonably consistent manner. The inability to make "better" 20 pm etalons, with improved finesse several limits the ability to make the necessary bandwidth measurements with the existing configuration. Consequently, applicants have upgraded to an etalon 162 with a shorter FSR (to narrow down the etalon slit function) and use a longer focal length imaging lens (to improve the linear dispersion of the etalon spectrometer 162 circuit, including the PDA 182). A relatively very narrow slit function etalon 162, e.g., a 3 pm FSR etalon combined was selected in combination with a, e.g., 1.5 m imaging lens, which together was determined to produce the desired capability of bandwidth tracking over the range of, e.g., 0.15 to 0.3 pm FWHM.

Improvement in the etalon 162 slit function and linear dispersion provides for greatly improved ability to track bandwidth without having to resort to a so-called "slope correction". There still exists a need to implement "blur correction" because the difference in the apparent bandwidth between that measured from an inner fringe versus an outer fringe can be as large as, e.g., 0.025 pm. This can be as large as almost the entire error budget for the bandwidth measurement accuracy required of the SAM module according to an embodiment of the present invention and consequently, e.g., "blur correction" is incorporated into the bandwidth calculation.

The energy monitor 144 in the SAM 46, according to an embodiment of the present invention, may have a polarization sensitivity because of the uncoated beam-splitter mirrors 104 and 140 that deliver a small percentage of the main beam 64 to the energy monitor 144, can have a polarization sensitivity. Using Fresnel's equations, it was determined that the polarization sensitivity of the energy monitor 144 to the input beam is 2.85:1:: Horizontal:Vertical.

A faster photodiode array 182 may be added to the SAM, in which event, e.g., an automatic adjustment circuit could be provided for the lithography or other user of the light source to, e.g., trigger to light out in, e.g., a sync out circuit that could be provided. This could eliminate the for certain measurements, e.g., with a diode instrument for measuring pulse length ("DIMPLE") and the need for adjustment when any of several modules are replaced.

Bandwidth numbers from the LAM 28 could be used in combination with the value reported by the SAM 46, e.g., to accurately determine "in-spec" and "out-of-spec" conditions. The different relative sensitivities of the LAM 28 and SAM 46, e.g., to the FWHM and E95 of the laser spectrum seen by each, can allow the use of a linear combination of the two reported values, e.g., to determine accurately the FWHM or E95 of the spectrum over a range of different spectral shapes.

The etalon 162 selected can consist, e.g., of a pair of air-spaced mirrors 174 (shown in FIG. 7) of fixed spacing. The specifications for the etalon 162 are driven, e.g., by requirements for the proper functioning of the etalon 162 under the operating parameters noted above, among others, including the requirements for an extended lifetime of this component. The selected parameters may include, e.g., free spectral range of, e.g., 3 pm at 193.36 nm, effective finesse of, e.g., $\geq 25$ over a 10 mm aperture, and peak transmission (ratio of the fringe peak photo-electrical signal and the input peak signal) of $\geq 50\%$ at 193.35 nm normal incidence.

Turning now to FIG. 7 there is shown in further detail the optical elements of the SAM 46 optical module 72 between the adjustable mirror M1 146 and the etalon 162. In this embodiment, the telescope front lens 150 of FIG. 4 and the combination optical element 152 of FIG. 4 are shown to be all contained in a single mounting frame 200, with the telescope front lens 204 contained in its mount 150 attached to the mounting frame 200 by a mounting screw 206, which also serves to hole in place a finger spring clip, which holds the lens 204 in place in its mounting frame 150. Within the mounting frame 200 is contained the elements of the combined optic 152 shown in FIG. 4, i.e., the telescope rear lens 220 and the first stage diffuser 222 and the spherical lens 224. The telescope rear lens 220 may be held in place on the mounting frame 200 by a mounting screw 246 and a circular spring clip 242. the spherical focusing lens 224 may be held in place by a pair of mounting screw 240 and associated finger spring clips 248. The second stage diffuser 230 may be held in place on the second stage diffuser mounting frame 160 by a mounting screw 236 and a finger spring clip 238. The mounting frame 200 may be attached to the plate 122 of the optics module 72 by mounting screws 210 and the second stage diffuser mounting frame 160 may be attached to the plate 122 by mounting screws 232. The etalon 162 may be attached to the plate 122 by mounting screws 170.

The front telescope lens may be a $CaF_2$ convex cylindrical lens, acting in conjunction with the rear telescope lens 220, which may also be made of $CaF_2$ and also be a concave cylindrical lens, to demagnify the beam 144, i.e., to make it smaller in cross-section. The diffractive diffuser 222 may also be made of $CaF_2$. The spherical focusing lens 224 may also be made of $CaF_2$ and have a focal length of, e.g., 1.5 meters. The etalon 162 may be a Fabrey-Perot etalon, e.g., having a free spectral range of about 3 pm and a finesse of greater than 25 at 193.350 nm. The etalon parameters and the focal length are selected to deliver to the PDA 182 essentially only the fringes from the two innermost interference rings, with the fringes covering essentially all of the photodiodes (pixels) in the array, although thee is some degree of tolerance, e.g., ±5 pixels, and the width of $D_{OD}$ for the outermost of the two fringes does vary as bandwidth and/or center wavelength varies.

The diffractive diffuser 222, which may be made of ArF laser grade fused silica, serves to homogenize the beam, resulting in a uniform redistribution of the input light beam. This can ensure, e.g., a proper mixing of the spatial information in the beam so that the light at the edge and the center will have equivalent wavelength resolution and brightness. Approximate specifications for such a binary diffractive diffuser 222 include, e.g., diffractive diffuser 222 dimensions of 10 mm×10 mm×2 mm, output pattern shape being rectangular, zero-order bleed through of ≦1%, full angular divergence in the horizontal of 10°±0.1° and in the vertical of 5°±0.1°. The material selected could also be excimer laser grade $CaF_2$.

The logic assembly 74 (SAM 46 electronics) residues inclose proximity to the SAM 46 optics module 72 due to close interaction with the two modules 72, 74. The PDM 44 according to an embodiment of the present invention can be located within the SAM 46 optics module 72. The SAM 46 and PDM 144 contain optics and electronics to perform their tacks; the logic assembly 74 contains only electronics to perform its tasks.

The SAM 46 may be mounted vertically to an optical table (not shown). The module 46 may be mounted to the bulkhead 122 with three captive thumbscrews 78 in the module allowing for easy module replacement. Sealing at the interfaces may be provided that is free of elastomers.

A link to the laser control system (not shown) may be provided, e.g., via a local network or ethernet port on the SAM 46. This connection may be, e.g., for non-time-critical commands and information. There can also be a connection from the SAM 46 directly to the firing control processor ("FPC") that can provide a high-speed data stream of metrology values for use in the control algorithms for controlling the laser system 20.

To avoid damage to the optics due to contamination and losses from absorption by oxygen, the laser beam path in the module 46 may be purged. A purge interface, e.g., for the primary beam splitter 80 may be provided, e.g., such that a nitrogen purge gas flows from the PA WEB 42 through the interior of the primary beam splitter 80 and is then exhausted through the purge outlet line at the PA 50 chamber window (not shown), i.e., within the bellows (not shown) to which the primary beam splitter flange 118 is connected.

The remaining optics in the SAM 46 (but outside the purge cell of the primary beam splitter 80) may be bathed in, e.g., dry nitrogen that may be fed to the module 46 via a fitting through the enclosure 76. The enclosure 76 may have a nitrogen purge rate for the enclosure of, e.g., 4 L/min and an oxygen level of not more than 5 ppm, with a leak rate for the primary beam splitter purge cell of, e.g., $1 \times 10^{-5}$ scc/s at 100 kPa over pressure.

The potential for so-called "white fuzz" damage (due to compaction under high UV fluence) to the $CaF_2$ primary beam splitter 80 mirror 104 has led applicants to utilize the 70° angle of beam incidence noted above. The internal optical layout of the SAM 46 is modified from prior wavemeter versions accordingly.

In a prototype configuration of the SAM 46, fluence levels at the primary beam splitter 80 mirror 104 wee estimated to be 52 to 105 $mJ/cm^2$, assuming 20 to 40 mJ pulse energies, a 9 mm×3 mm beam size and the primary beam splitter 80 mirror 104 oriented at 45 degrees to the beam propagation direction. This compares to prior fluence levels seen by the primary beam splitter in applicants' assignee's 70XX products of approximately 13 $mJ/cm^2$ assuming a 12.5 mm×2.2 mm beam at a 5 mJ/pulse.

With a reorientation of the primary beam splitter mirror 104 from 45° to 70° there is a reduction of the fluence at the primary splitter mirror 104 to about 25 to 51 $mJ/cm^2$. There still remains a risk of "white fuzz" damage which must still be accounted for in the design. A re-designed mounting could accommodate either $CaF_2$ or $MgF_2$ material.

Figure 5:
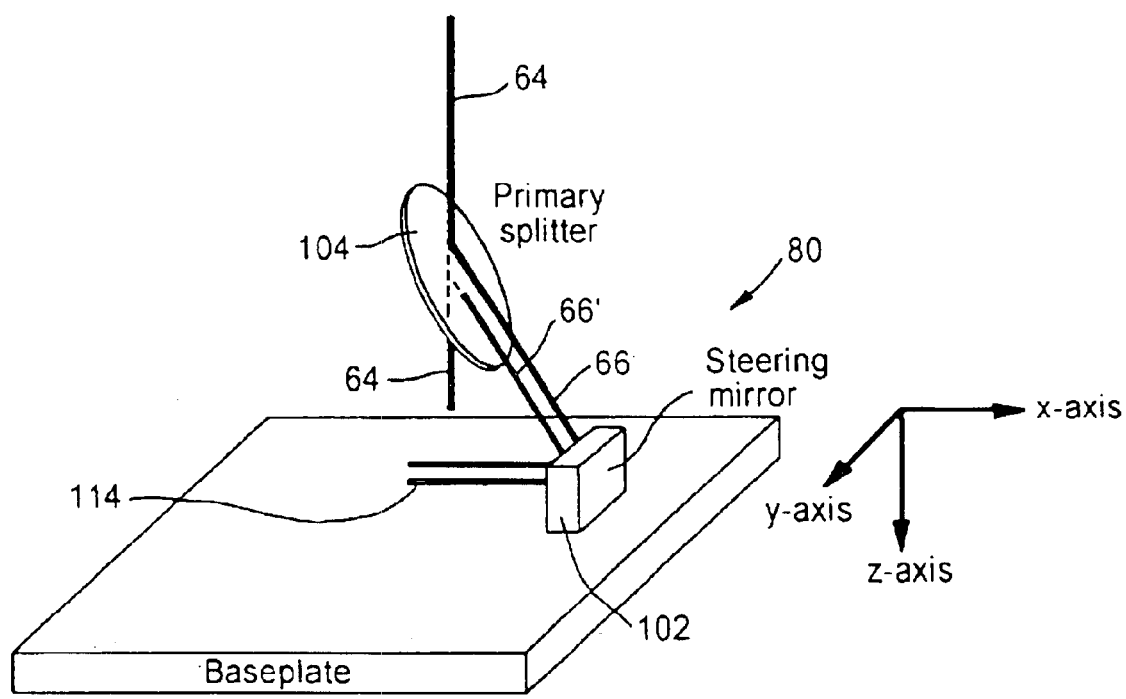
FIG. 5 shows a schematic representation of a portion of the spectral analysis module according to an embodiment of the present invention.

Defining a co-ordinate system with respect to the laser system 20, e.g., as seen in FIG. 5, utilizing a right-handed co-ordinate system, the z-axis could be, e.g., the laser beam propagation direction, the x-axis the vertically upward direction, and the y-axis the horizontal towards the user, i.e., out of the paper. In such a coordinate system, the primary splitter 80 mirror may be circular 40 mm flat that is, e.g., 2 mm thick and is oriented such that the angle about the x-axis θ=70°, the angle about the z-axis φ=0°. This results in a total displacement of the beam center by a distance d after going through the primary splitter mirror 104. For, e.g., $CaF_2$ material (n=1.5018@193 nm), the beam displacements with respect to the co-ordinate system defined above would be:

Δx=+0.0 mm

Δy=+1.33 mm where it was assumed that the refractive index of $N_2$ at 1 atm=1.0003.

For $MgF_2$ material, the refractive index along the direction of propagation has to be first determined. Given that the refractive indices for the ordinary ray, $n_o=1.4305$, and for the extraordinary ray, $n_e=1.444$, and assuming that the optic is cut with its flat surfaces perpendicular to the c-axis, the refractive index in the direction of propagation along the z-axis within the medium reduces to $n=1.4362$. Consequently, the beam displacements are given by:

$$\Delta x = +0.0 \text{ mm}$$

$$\Delta y = +1.29 \text{ mm}$$

which is not very different from the displacement with $CaF_2$.

The beam separation between the centers of two fresnel reflections from the primary splitter mirror 104 would be given by:

$$d = 2*t*(\tan\theta_i)*(\cos\theta_r)$$

for $\theta_i=70°$ and using the material properties listed above,

→for $CaF_2$, d=1.1 mm

→for $MgF_2$, d=1.2 mm for light polarized purely along the y-axis, the reflectively of the splitter is given by:

| | |
|---|---|
| $I_{11}$ | $= I_{0y} [\{P_{70} \cos^2(0)\} + \{S_{70} \sin^2(0)\}]$ |
| | $= I_{0y} P_{70}$ | where $P_{70}$ is the reflectivity of p-polarized light at 70 degrees angle of incidence, $I_{11}$ is the intensity of light reflected from the front surface of the primary splitter mirror 104, and $I_{0y}$ that of the horizontally polarized incident light.

$$I_{12} = (I_{0y}-I_{11})P_{70}-(I_{0y}-I_{11})(P_{70})^2$$

where $I_{12}$ is the intensity of light exiting the front fact of the primary splitter mirror 104 after reflection from the rear surface of the primary splitter mirror 104. The total intensity reflected into the metrology module 46 in beam 114 is given by:

| | | |
|---|---|---|
| | $I_R$ | $= I_{11} + I_{12}$ |
| ⇨ | for $CaF_2$, | $= 0.08133 I_{0y}$ |
| ⇨ | for $MgF_2$, | $= 0.08632 I_{0y}$ |

A secondary splitter 140 then reflects a part of this light in beam 114 to the energy monitor 144. Its orientation is such that the reflected light is given by:

| | |
|---|---|
| $I_{21}$ | $= S_{45} (I_{11} + I_{12})$ |
| $I_{22}$ | $= S_{45} (I_{11} + I_{12} - I_{21}) - (S_{45})^2 (I_{11} + I_{12} - I_{21})$ | where $I_{21}$ and $I_{22}$ are the intensities of the light reflected to the energy monitor 144 from the front and rear surfaces of the secondary splitter mirror 140. The fraction of the incident intensity that is reflected into the energy monitor 144, for horizontally polarized light, is given by:

| | | |
|---|---|---|
| | $I_R$ | $= I_{21} + I_{22}$ |
| ⇨ | for $CaF_2$, | $= 0.0137 I_{0y}$ |
| ⇨ | for $MgF_2$, | $= 0.01454 I_{0y}$ |

The fraction of the incident intensity that is reflected into the energy monitor 144 for vertically polarized light is given by:

| | | |
|---|---|---|
| ⇨ | for $CaF_2$, | $= 0.00756 I_{0x}$ |
| ⇨ | for $MgF_2$, | $= 0.00702 I_{0x}$ |

This analysis assumes there are no losses between the primary splitter mirror 104 and the secondary splitter 140 (absence of any windows or additional secondary splitters in between), however, in the embodiment disclosed above there are two windows 110 and 112, and a steering mirror 102 between the primary beam splitter mirror 104 and the secondary beam splitter 140, which will reduce the calculated intensities by approximately 10%, assuming vertically polarized light with respect to the horizontal axis of the beam, and varying greatly with polarization as is known in the art.

Figure 8A:
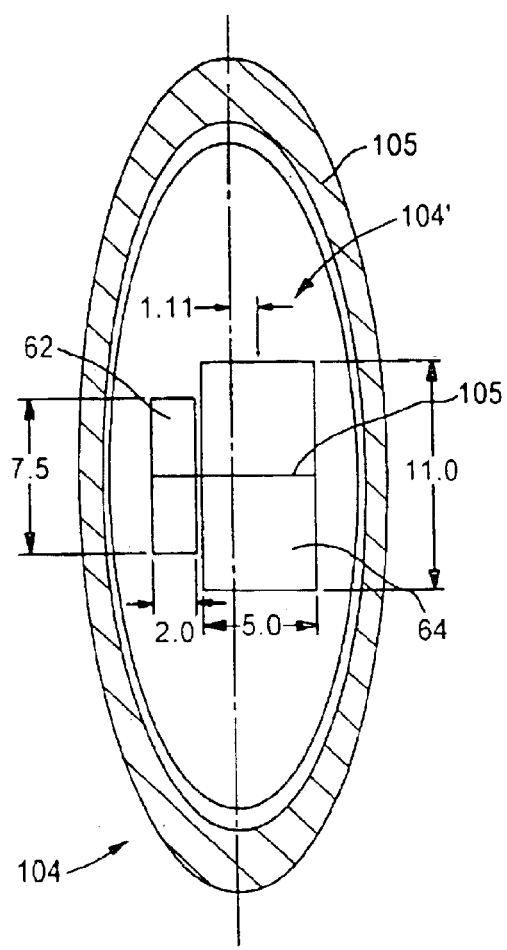
FIGS. 8a and b show the fluence pattern on the front and back of a beam splitting mirror according to an embodiment of the present invention.
Figure 8B:
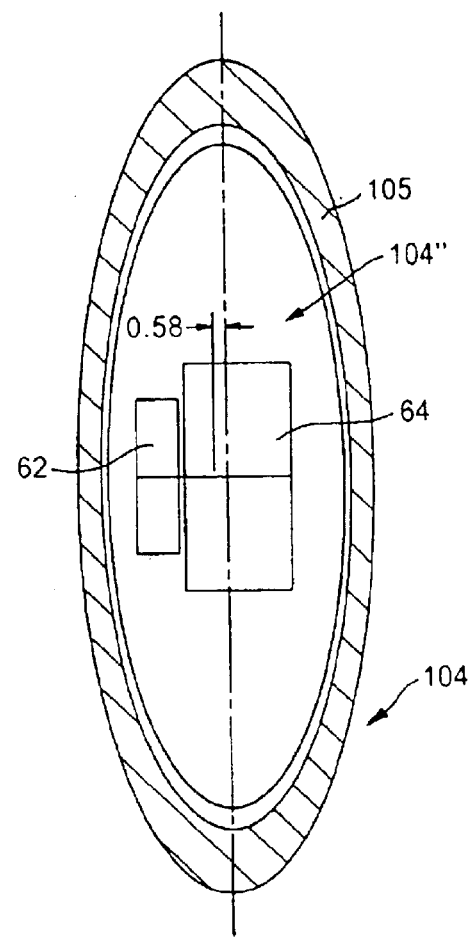

The 70-degree angle of incidence dramatically increases the size of the beam footprint on the splitter mirror 104 surface. The situation is further complicated by the requirement that primary splitter mirror 104 in the SAM 46 has to accommodate the double pass (MO beam 62 one way and PA beam 64 going the other way), as is shown in FIGS. 3 and 8. The beam sizes, separation and angle as defined by the system ray trace are, as shown in FIG. 8:

| | | |
|---|---|---|
| MO beam | horizontal profile | 2.0 mm |
| | vertical profile | 7.5 mm |
| PA beam | horizontal profile | 5.0 mm |
| | vertical profile | 11.0 mm |
| Center-to-center separation | | 3.72 mm |
| Tilt between MO and PA beams | | 6.7 mrad |

FIG. 8 shows the beam footprint on the chamber face 104' of the primary splitter mirror 104 and the shutter face 104" of the primary splitter mirror 104. The hatched areas 105 indicate an approximate "keep-out" area used for mounting the optic 104. The 32-mm diameter circle serves to allow for some margin for the available space for the two beams. At the chamber face 104' of the primary splitter mirror 104, the MO beam 62 and PA beam 64 are positioned such that the midpoint of the line 105 spanning the two beams 62, 64 coincides with center of the face of the optic 104'.

At the shutter face 104", facing an output shutter, e.g., in the PA WEB 42, a beam shift of, e.g., 1.3 mm is observed. However, that shift is more than compensated by the face-shift of 1.88 mm due to the 70-degree perspective of a 2 mm thick splitter mirror 104. Consequently, the midpoint of the line spanning the two beams is 0.58 mm from the center of the shutter-face 104" of the optic 104. Under such tight space constraints, there is very little scope for tolerating alignment errors.

A schematic view of the general optical layout is shown in FIG. 5. FIG. 5 shows schematically the orientation of the primary splitter mirror 104. The reflected light 66, 66' is steered into the optical plane of the wavemeter with the steering mirror 102. For an angle of incidence of 70 degrees with a $CaF_2$ primary splitter mirror 104, the angle of incidence at the steering mirror 102 is 25°. Assuming a top-hat profile of intensity distribution across the beam path, i.e., more or less equal across the entire beam path, for the beam 64, 30 mJ nominal pulse energy for a 9 mm×3 mm beam, the maximum fluence at the primary splitter mirror 104 is where the incident beam 66 at the chamber side primary surface 104' and the beam 66' reflected from the shutter side secondary surface 104" overlap (FIG. 5, being schematic and for illustration purposes, not showing any beam overlap). This maximum fluence can be estimated as follows:

| | |
|---|---|
| Incident beam fluence | = Cos(70)*30.0/(0.9*0.3) |
| | = 38 mJ/cm$^2$ |
| Reflected beam fluence | = Cos(70)* (0.0389)*30.0/(0.9*0.3) |
| | = 1.48 mJ/cm$^2$ |
| ⇒ Total fluence | = 39.5 mJ/cm$^2$. |

For a range of 20 to 40 mJ/pulse, the fluence range is 26.3 to 52.6 mJ/cm$^2$ at the primary splitter mirror 104.

At the steering mirror 102, the maximum fluence level is given by:

| | |
|---|---|
| Fluence from front face reflection | = Cos(25)*(0.0424)*30.0/(0.9*0.3) |
| | = 4.27 mJ/cm$^2$ |
| Fluence from rear face reflection | = Cos(25)*(0.0389)*30.0/(0.9*0.3) |
| | = 3.92 mJ/cm$^2$ |
| ⇒ Total fluence | = 8.2 mJ/cm$^2$. |

For a range of 20 to 40 mJ/pulse, the fluence range at the steering mirror (a dielectric coated optic) is 5.5 to 11.0 mJ/cm$^2$.

Returning to FIG. 4, the overall optical layout within the SAM 46 optical portion 72 is shown. As noted above, the light from the primary splitter mirror 104 is reflected into the optical plane of the wavemeter in beam 114. The approximate fluences at the various optical elements leading up to the second stage diffuser 160 can be estimated, continuing with the assumptions made above. The range of fluences listed below are for 20 to 40 mJ/pulse energies, and assuming a 2.2 demagnification ratio along the long axis of the beam 114 using a cylindrical telescope setup, as noted above:

| | |
|---|---|
| M1 adjustable mirror 146: | 4.1 to 8.3 mJ/cm$^2$ |
| Telescope front lens 204: | 5.8 to 11.7 mJ/cm$^2$ |
| Telescope rear lens 220: | 11.8 to 23.7 mJ/cm$^2$ |
| Diffractive diffuser 222: | 10.9 to 21.8 mJ/cm$^2$ |
| Focusing lens 224: | 7.6 to 15.3 mJ/cm$^2$ |
| Second stage diffuser 230: | 7 to 14 mJ/cm$^2$ |

As a consequence of the overlap of the two fresnel reflections from the primary splitter mirror 104, the fluence levels at the telescope rear lens 220 and the diffractive diffuser 222 can be considered to be considerably high, with a possibility of damage. In order to alleviate this applicants have, e.g., incorporated a cylindrical telescope and/or utilized $MgF_2$.

Figure 6:
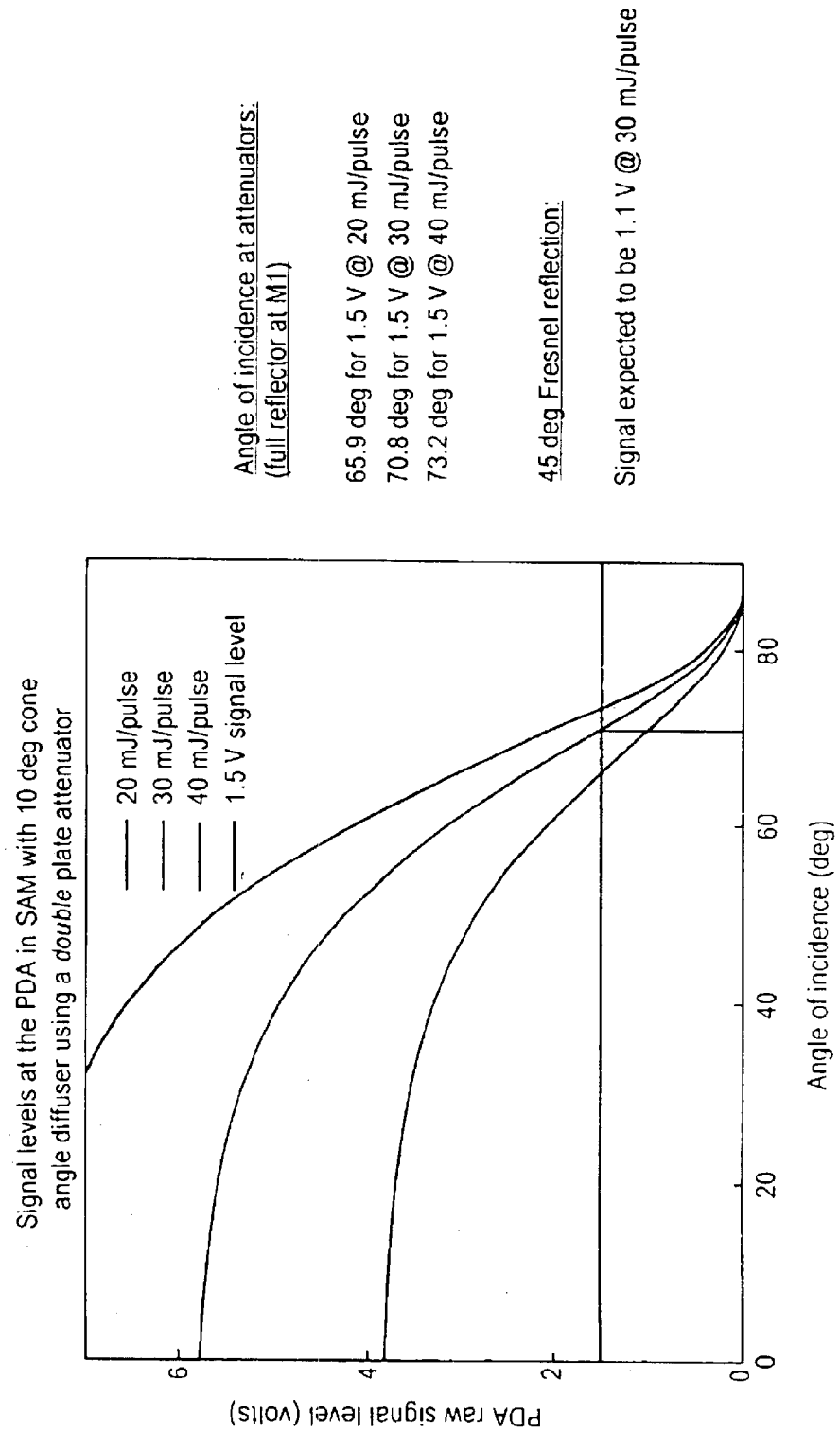
FIG. 6 shows a graph of the performance of an element of a module according to an embodiment of the present invention.

Turning now to FIG. 6, there is shown the output signal levels from the PDA 182 in the SAM 46 for differing levels of fluence (20 mJ/pulse, 30 mJ/pulse and 40 mJ/pulse) and their intersection with the 1.5V signal output line. For a 1.5 V output for each respective level of fluence noted the incidence angles are respectively 65.9°, 70.8° and 73.2°. This is assuming a, e.g., 10 degree or so cone angle diffuser 230.

During life testing of a pilot module of the wavemeter portion of the SAM 46, applicants discovered that there was evidence of damage to the first stage diffractive diffuser 222 after accumulation of about one billion shots, in a design likely to see a much lower fluence than in the embodiments described in the present application. Since the first stage diffractive diffuser 222 in the SAM 46 faces considerable risk of damage from high fluence levels fused silica optics were deemed to probably not be able to be used since at fluence levels greater than 1 mJ/cm$^2$ the risk of damage, e.g., due to compaction is very significant. Different possible solutions present themselves to the likelihood of damage to the diffractive diffuser 222. Making the diffractive diffuser from $CaF_2$ instead of fused silica is one choice. Another choice could be to, e.g., decrease the magnification of the combination of the front telescope lens 204 and the telescope rear lens 220, to increase the size of the beam 114 incident on the diffractive diffuser 222, thereby reducing the fluence per c$^2$. In addition a combination of the two, or even the selection of other possible fused silica materials along with de-magnification of the beam may be utilized. Applicants believe that it is possible that other lifetime limitations arising from damage to fused silica optical elements could be also achieved with in this effort. For example, the front telescope lens 220 may be large enough to have acceptable fluence even with fused silica material. Comparable fluence levels incident on a ground glass diffuser, such as second stage diffuser 230, may be ignored because compaction type damage to the element would not be expected to dramatically alter or affect its diffusion properties. The second stage diffuser 230 may be formed of a flat piece of glass with a grounded surface to induce diffusion which can then, e.g., be etched by bathing the surface, e.g., in a bath of ammonium bi-fluoride ("ABF"), which, among other things, enhances the diffusion uniformity.

Applicants have chosen in one embodiment to make the front telescope lens 204, the rear telescope lens 220 and the first stage diffractive diffuser 222 and the focusing lens 224 all of $CaF_2$ and also to de-magnify, though the embodiment could also include other variations, e.g., the front telescope lens and the focusing lens made of ArF grade or better (from a compaction standpoint) fused silica. These choice are dictated, at least in part, by the question of whether compaction from, e.g., up to 20 billion shots at even marginal fluences (1 to 3 mJ/cm$^2$) incident on a fused silica lens, e.g., being used in a non-imaging application, is drastic enough to warrant a change to calcium fluoride material.

Redesigning the illumination scheme to reduce the fluence levels at the diffractive diffuser 222, e.g., primarily by changing, e.g., the de-magnification ratio of the telescope produces considerable potential benefit. Moreover, applicants have chosen a telescope with cylindrical lenses, and therefore, the orientation of the lenses would be such that only the long axis of the beam 114 would get demagnified. As a result, the fluence at the diffractive diffuser 222 would be lower than that with a telescope consisting of similar spherical lenses, because the fluence can be better spread across the rectangular shape of the diffuser 222, with its long axis coinciding with the long axis of the beam 114.

Another possible embodiment could entail removing the telescope system 204, 220 altogether. A drawback from having an extended source incident on the diffractive diffuser 222 could be that the beam 114 angles incident on the ground glass diffuser 230 get steeper. The ground glass diffuser 230 that scrambles the angular information in the beam is not perfect. As the angle gets steeper, its ability to uniformly scramble the angular information in the beam 114 degrades. As a result, the whole source beam 114 may not be uniformly sampled by the etalon, thereby leading to inaccuracies in the metrology.

The implementation of the embodiment utilizing spherical lenses, alternatively, can be further optimized by expanding the beam along the short axis, e.g., by using a prism. For example, allowing for a 3× beam expansion could result in, e.g., a 9 mm×9 mm beam incident on the telescope system 204, 220. After passing through, e.g., a 1.8× de-magnification telescope the beam could be reduced, e.g., to a 5 mm×9 mm beam, with further reduced fluence levels at the diffractive diffuser 222. However, such a beam expansion could result in unsatisfactorily increasing the separation between the two Fresnel images, e.g., causing over fill the diffractive diffuser 222. The short axis of the beam 114, e.g., at a 30 degree angle to the horizontal, could result, following a beam expansion, in the light in the beam 114 being directed along a skewed angle requiring additional mirrors simply to get the beam 114 back to the necessary height above the base plate 122 for entry into the etalon 162. This is, however, a possible though perhaps more complex option.

It is particularly attractive, however, to optimize the beam 114 size at the diffractive diffuser 222, e.g., by expanding the beam along the short axis and reducing the beam size along its long axis with the use of cylindrical lens pairs for each of the horizontal and vertical axes. Assuming a symmetrical setup with a 1.87× de-magnification along the long axis and a 1.87× magnification along the short axis, the beam size could be, e.g., 4.8 mm×5.6 mm beam. This could make an ideal system. However, expansion along the short axis could also increase the separation between the two Fresnel reflection images 66, 66' when incident on the aperture of the diffractive diffuser 222. This can be avoided, e.g., by blocking one of the Fresnel images 66, 66'. However, with the center-to-center separation between the two Fresnel images 66, 66' coming out of the primary splitter 80, e.g., about 5.3 mm, implementing an aperture to block one of the Fresnel reflections 66, 66' may be difficult, though not undoable. For example, a design implementation could be done, e.g., with three lenses, e.g., involving a symmetric setup with a spherical lens in-between two cylindrical lenses oriented perpendicular to each other. This could result in expansion along one axis and a de-magnification along the other.

Other optics related improvements in the embodiments of the present invention relating to improving the efficiency and efficacy of beam homogenization include improving the low quantum efficiency of the PDA 182 used for fringe detection. Improving the detector efficiency could reduce the need to use relatively high fluences in the whole train of optics in the SAM 46, and also in the LAM 28, particularly beneficial in retaining fused silica optical components. However, if constrained to the same PDA 182, the above-mentioned optical improvements could be necessary.

To summarize the possibilities one could, according to embodiments of the present invention use a diffractive diffuser 222 made from calcium fluoride; use spherical lenses with the de-magnification ratio changed to 2.0; use cylindrical lenses with de-magnification ratio 2.0, remove the telescope; or use two cylindrical lenses and one spherical lens with 1.87 de-magnification along the long axis and 1.87 magnification along the short axis. Various combinations of materials and embodiments between $CaF_2$ and SF could also be availed by the choice of the particular solution.

Figure 9A:
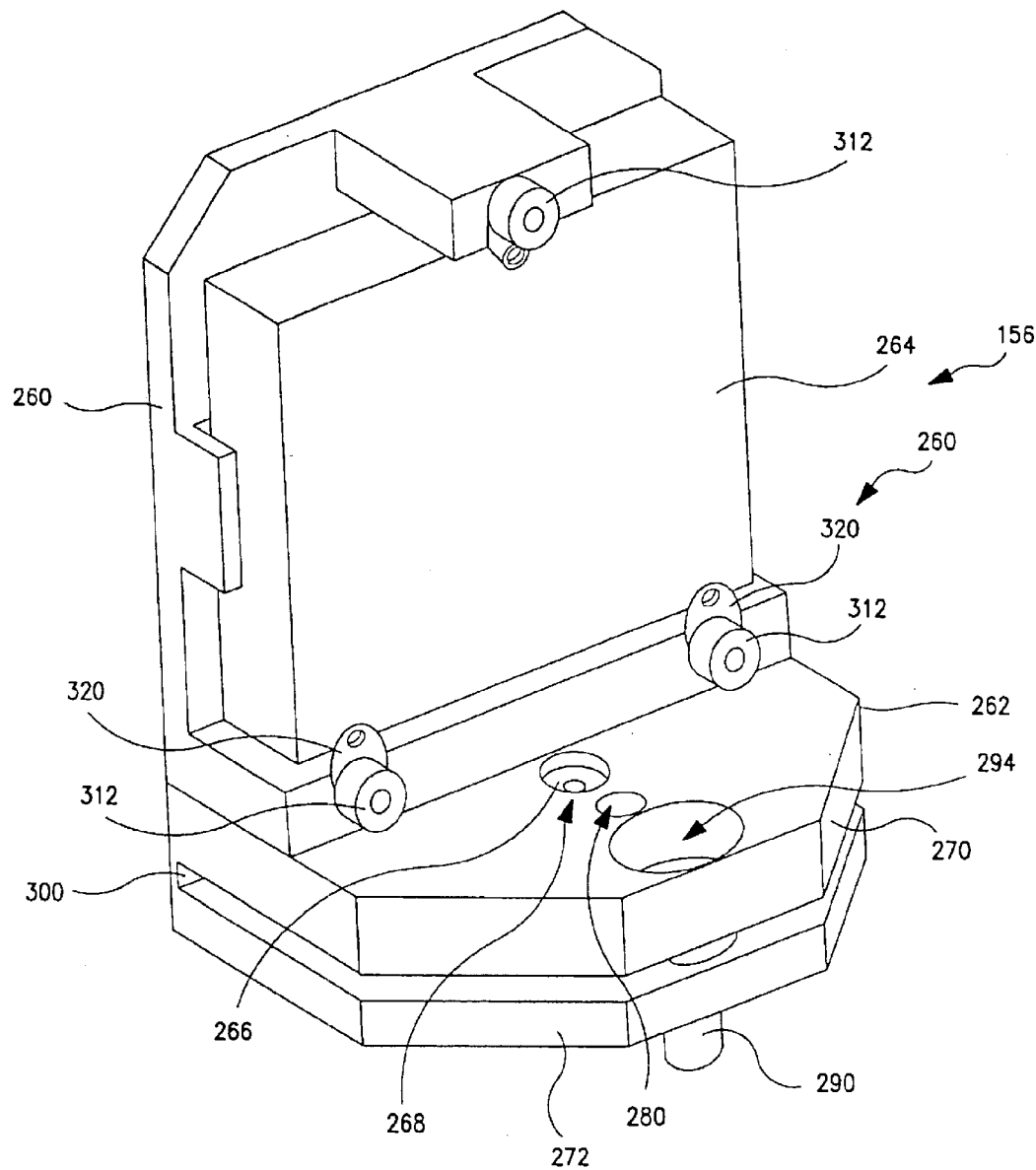
FIGS. 9a and b show perspective views of an adjustable mirror mounting according to a embodiment of the present invention.
Figure 10A:
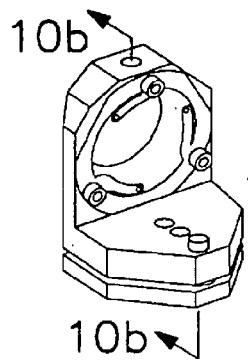
FIGS. 10a–c show additional embodiments of the adjustable mirror mounting shown in FIGS. 9a–b, with a circular mirror, and with FIG. 10b being a cross section of FIGS. 9a or 10a, along the cross-section lines 10b—10b shown in FIG. 10a, excepting that FIG. 10a shows the mounting of FIG. 10a with the mirror removed.
Figure 10C:
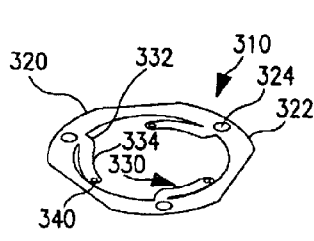
Figure 10B:
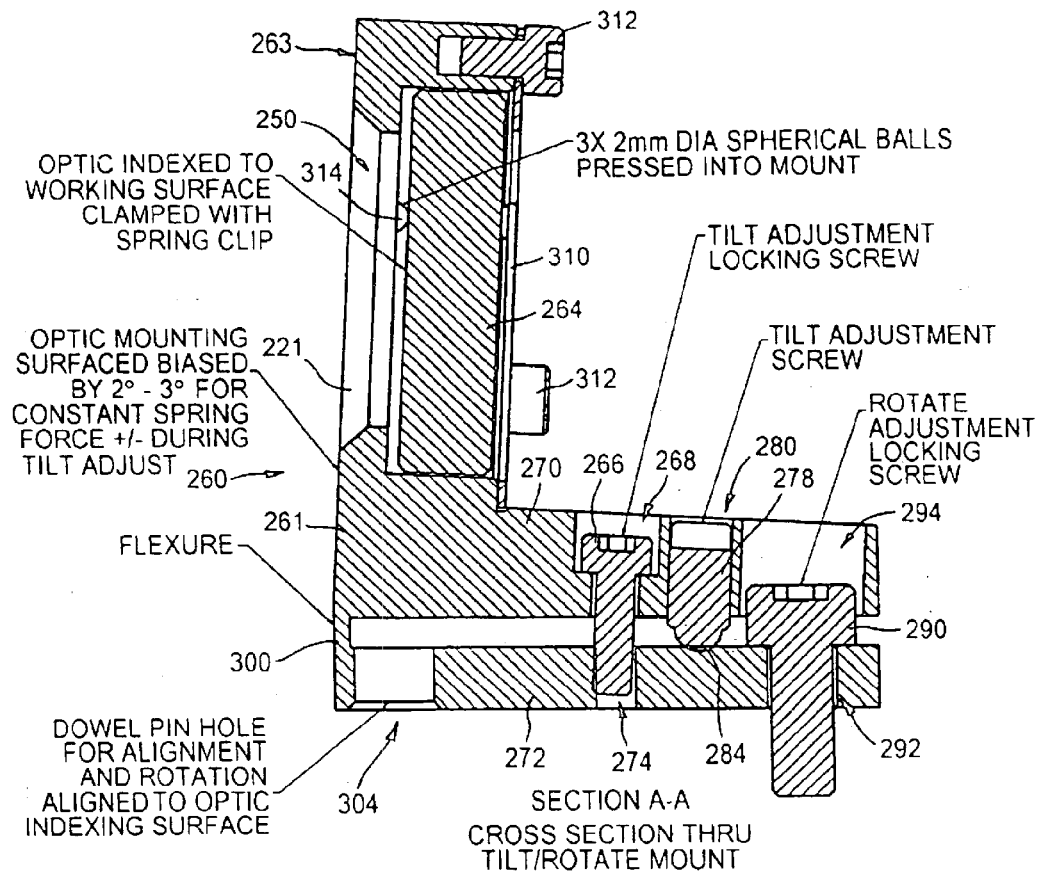

Turning now to FIGS. 9a and b, and 10a and b, with FIG. 10b being a cross section of the mirror mount 260, along the lines 10b–10b in FIG. 10 a (except that the embodiment in FIG. 10a has the mirror 264 removed), there is shown a perspective view of the front and the back of an adjustable mirror mounting 260 and mirror, e.g., mirror M2 156 and the cross sectional view. The mirror 156 has an adjustable mirror mounting frame 260, which may comprise an upper foot 270 extending laterally from a generally vertical mirror mounting portion 261, along with a lower foot 272, forming a base for the vertical portion 261. As shown in More detail in FIG. 10b, the vertical portion 261 and its upper foot 270 are attached to the lower foot 272 by means of a thin relatively narrow flexure 300, so that the upper foot 270 and vertical mirror mounting portion 261 can bend with respect to the lower foot 272, for alignment of the mirror 264 mounted on the mount 260 in the vertical plane of the incident beam (not shown), i.e., pivoting about the horizontal axis of the flexure 300. In addition, the front face 263 of the vertical portion 262 is machined to have the surface 263 biased by about 2°–3° in order for there to be a constant spring force in the flexure 300 for purposes of maintaining a constant spring force during tilt adjustment.

The mirror optic 264 is mounted in a recess in the rear side of the vertical portion 261 and is indexed to the working surface and clamped in place by a circular spring clip 310, shown in greater detail in FIG. 10c, which is in turn held in place by a plurality of spring clip mounting screws 312. The indexing may be performed by utilizing, e.g., a plurality of spherical tooling balls 314, one of which is shown in FIG. 10b, which may be placed in machined openings in the vertical portion of the mount, e.g., 261 in FIG. 10b and are aligned to engage the mirror or other optic being mounted, e.g., mirror 264 in FIG. 10b on the opposite side of the mirror from the spring clip engagement ball, e.g. 340 shown in FIG. 10c, so that the holding forces on the optic are balanced and do not result in inducing stress into the optic. Such stress may, e.g., cause bi-refringence in the optic. The embodiment shown in FIG. 9a uses a plurality of finger spring clips 320. The mount 260 can be mounted on a dowel pin (not shown) extending into a dowel pin opening 304 in the bottom foot 272, and pivoted to align the mirror 264 in the horizontal plane of the incident beam (not shown). The dowel pin opening 304 and the dowel pin it receives (not shown), which is mounted on the plate 122 are indexed to the required position of the optical plane of the optic, e.g., mirror 264. That is, when the dowel pin (not shown) is inserted into the dowel pin opening 304 the mirror indexed in the mounting 260 is in precisely the plane it should be, e.g., when also aligned if pointing direction, if adjustable in that axis. The dowel pin and its receiving opening 304, therefore serve as a key to aligning the optical plane of the optic, e.g., mirror 264, and also for horizontal pivoting, if required.

A rotate adjustment locking screw 290, extending through a rotate adjustment locking screw opening 294 in the upper foot 270 and a similar opening 292 in the lower foot 272, and into an arced slot (not shown) in the plate 122 of the SAM 46, and held in place by a cap screw (not shown) fixes the horizontal alignment of the mount 260. A vertical (tilt) adjustment screw 272 extending through a threaded opening 280 in the upper foot 270 and having a ball tip engaging the lower foot 272 can be utilized to set the tilt of the vertical portion 261 and this position may then be fixed by a tilt adjustment locking screw 266 extending through a tilt adjustment locking screw opening 268 in the upper foot 270 and into a threaded opening 274 in the lower foot.

The embodiment of FIG. 10a shows a similar mount 260 from which a mirror in the form of a circular mirror has been removed and on which is mounted a circular spring clip 310, shown in more detail in FIG. 10c. The circular spring clip 310 can have a ring portion 320 including a plurality of mounting screw extensions 322 in which are formed mounting screw holes 324. The circular spring clip 310 also has a plurality of spring clip 330 attached to the ring by spring clip connections 332 and extending through spring clip arms 334 to a terminal extension at which may be placed a spring clip engagement protrusion 340 in the shape of hemisphere to facilitate engagement of, e.g., an optical element without damage to the optical element.

Figure 9B:
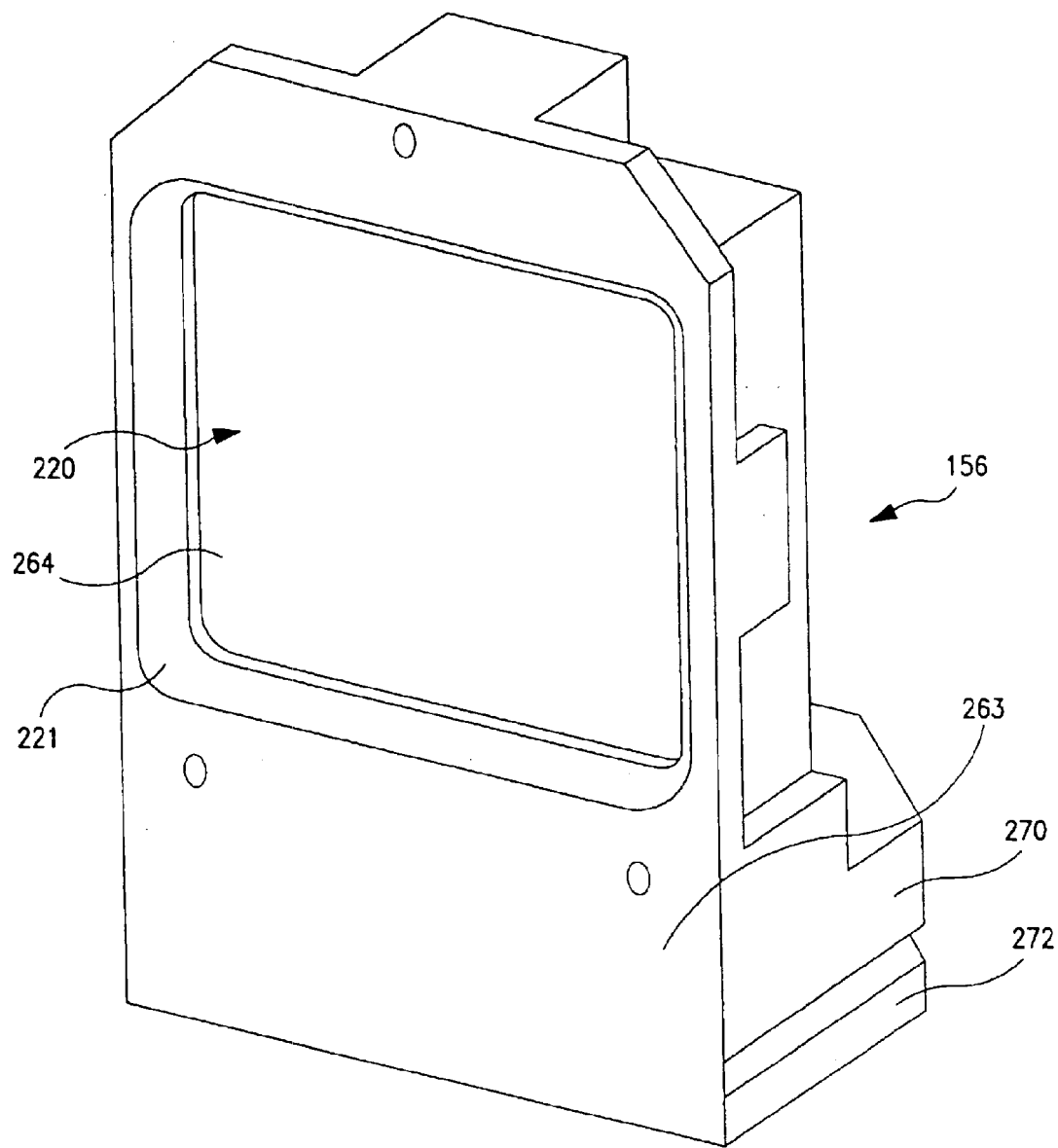
Figure 11:
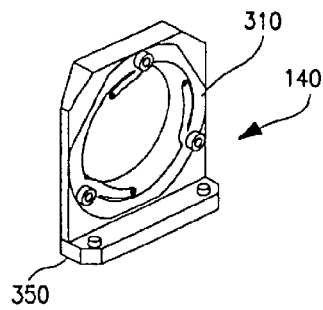
FIG. 11 shows another optic mounting according to an embodiment of the present invention.
Figure 12A:
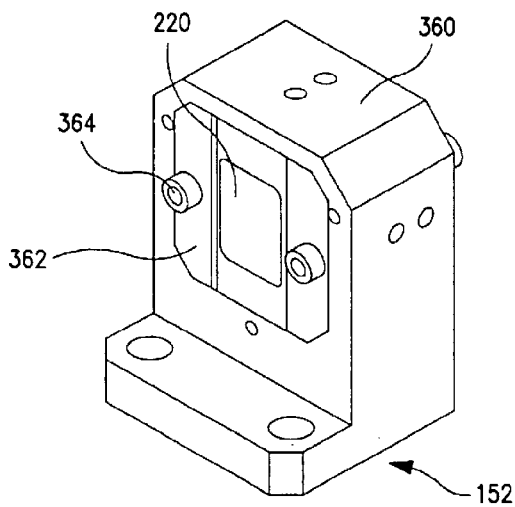
FIGS. 12a–c show another optic mounting according to an embodiment of the present invention.
Figure 12B:
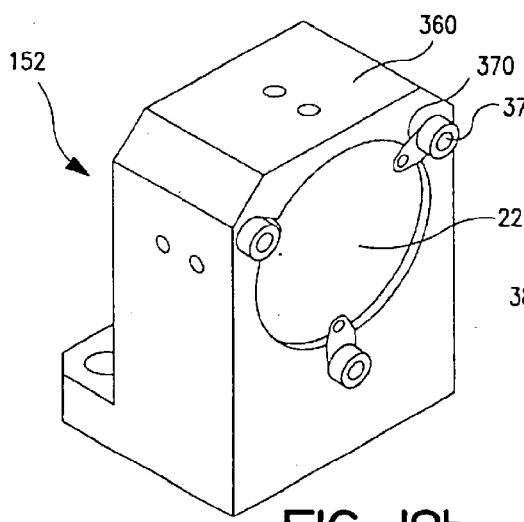
Figure 12C:
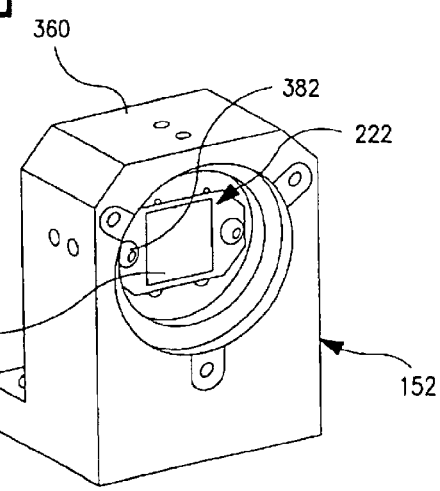

The embodiment shown in FIG. 11 is a secondary beam splitter mirror mount 350, which is similar to those in FIGS. 9 and 10 without the upper and lower feet and flexure, i.e., a fixed and non adjustable mirror mount, e.g., for secondary beam splitter 140. Shown in FIGS. 12a–b is a mounting frame, e.g., mounting frame 152 for mounting the combination optical elements shown, e.g., in FIG. 7. FIG. 12a shows the combination optic mounting frame 360 comprising a telescope rear lens 220 held in place by a retaining clip 363 mounted to the combination optic mounting 360 by a pair of mounting screws 364. FIG. 12b shows the back end of the mount 360 with the spherical focusing lens 224 held in place in a recess in the mount 360 by a plurality of finger spring clips that are attached to the mount by a plurality of mounting screws 372. FIG. 12b shows the mount with the focus lens 224 removed to show the first stage diffraction diffuser 222 held in place within the recess by a retaining clip attached to the mounting 360 by a pair of retaining clip mounting screws 382.

FIGS. 13a and b show a slit assembly, e.g., for mounting the second stage diffuser, i.e., 160 as shown in FIG. 4. The slit assembly mounting frame 390 may comprise a slit assembly 392 adjustably positioned on the mounting frame 390 by way of a pair of slots 400 and a respective pair of adjustment screws 404 on a front vertical portion 401 of the slit assembly 392, as well as a side slot 402 extending vertically in a side portion 403 of the slit assembly, along with a side adjustment screw 406. The front side of the slit assembly 390 faces the etalon as shown in FIG. 4. The slit assembly 390 also includes in the front vertical portion the slit 394 attached to the slit assembly 392 by a pair of mounting screws 396. FIG. 13a shows the slit assembly 392 in the down position acting as an aperture for the second stage diffuser 230, between the diffuser 230 and the etalon 162. FIG. 13b shows the slit assembly 392 in the retracted position for alignment between the diffuser 230 and the etalon 162. FIG. 13c shows the vertical positioning screw 412 threaded through a vertical positioning flange 418 on the mounting 390 and the second stage diffuser 230 held in place by a plurality of finge spring clips, with the slit assembly 392 in the down position. FIG. 13d shows the slit assembly 392 in the retracted position.

The slit opening 394 may also be adjusted side to side by horizontal adjustment screw 406, with the slot 414 in the top of the assembly 392 accommodating side to side motion of screw 412. The adjustment screws 406 and 412 have a very fine pitch, e.g., M4×0.50, enabling very fine positioning of the slit assembly 392 to optically align the slit. These screws 406, 412, as shown, may have hex-nut or the like tops to facilitate rotation with, e.g., an adjustment wrench.

In operation it will be understood that the selected narrow width of the primary bean splitter mirror 104 resulting in the fresnel reflections overlapping has been addressed in an embodiment of the present invention. The angle of incidence for both the MO 22 output laser beam 62 and the PA 50 output laser beam 64 has been selected to be at least 70° in order to adequately protect the primary beam splitter mirror 104 from damage through exceeding the damage threshold of fluence for, e.g., $MgF_2$ and allowing sufficient room for each beam 62, 64 to pass through the mirror 104 without the area of incidence of the beams 62 and 64 intersecting (though the fresnel reflections of both the passed and reflected portions of the PA beam may and most likely do overlap) and to provide an minimum of displacement of the path of the PA beam 64. At the same time, enough of the beam 64 is reflected into the wavemeter portion of the SAM 46 to enable the PDM 144 and PDA 182 to function (provide an accurate output signal with, e.g., adequate signal to noise ratio to be useful within the above referenced specifications on a pulse to pulse basis). Further, the 70° AOI of an embodiment of the present invention enables the secondary beam splitter to avoid exceeding its threshold of damage due, e.g., to high UV fluence level through the optic, even with exposure to the overlapped fresnel reflections in beam 114. There may also be a maximum angle of incidence depending on, e.g., the overall size of the mirror and the respective beam 62, 64 footprints at incidence on the mirror 104 and desired tolerances. Differing materials used for the mirror 104, e.g., if material with higher thresholds for damage in light with DUV wavelengths and below becomes available, and or used in the wavemeter portion of the SAM 46, PDA's with more pixels per the current pitch and/or more sensitive/accurate detectors forming each of the pixels, may also result in reducing the AOI at the primary beam splitter mirror 104 to somewhat less than 70°, but the AOI of the primary beam splitter will still be significantly larger than for prior lasers that neither have the overall output power requirements of lasers according to an embodiment of the present invention nor an output 62 of an MO laser chamber 22 sharing the available surface of the primary beam splitter mirror 104.

The etalon 162 slit function along with the focal length of the focusing lens 224 were selected to deliver to the photodiode array of the PDA 182 essentially only the innermost rings of the interference pattern created by the etalon, which also can be created by other optical interferometers, e.g., gratings, also having a slit function, so that the PDA can be assured over the range of the VW measurement and wavelength tuning of the laser to have at least one of the two interference rings with which to determine the pixel positions of the respective fringes in order to enable a BW calculation. The bandwidth calculation has been simplified to facilitate processing in the wavemeter microprocessor.

The primary beam splitter 104 passes the vast majority of the output laser beam 64 from the PA 50, i.e., approximately 95%, the exact amount of which may vary somewhat based upon such things as power requirements and fluence limits in the SAM, and reflects the remainder, a first small portion 114, of the beam 64 to the SAM wavemeter. The beam splitter 140 in the wavemeter in the SAM 46 reflects the vast majority, e.g., approximately 95% of the first small portion 114 of the beam 64 to the PDM 144. This also may vary somewhat due to such things as the amount of light needed by the PDM 144 and fluence limitations in the SAM, but the remainder, approximately 5% of the first small portion 114 of the beam 64 forms a second small portion of the beam which passes through the remaining optics in the wavemeter of the SAM 46.

The above-described embodiments of the present invention are intended only for explanation and illustration purposes and are not the only embodiments in which the present invention may reside. Those skilled in the art will understood that many modifications and changes may be made to the described embodiments without changing the intent and spirit of the present invention. For example, the present embodiment contemplates a detector employing an array of photodiodes. However, other photosensitive elements could be used, e.g., photosensitive integrated circuits, e.g., CMOS or CCD devices could be used and when the term effectively illuminating each photodiode in a photodiode array is used it contemplates the effective illumination of other such forms of photo-sensitive elements. In addition, currently contemplated is to illuminate the present invention embodiment photodiodes over their entire vertical extent, i.e., 0.5 mm, but more efficient photodiodes or improvements in, e.g., the signal to noise ratio of their outputs could enable effective illumination (meaning an illumination which produces an acceptably accurate electrical output signal from the photosensitive element, e.g., the photodiode, that will enable measurement of the amplitude of the intensity of the light at the particular photo-sensitive element). The scope of the present invention, therefore, should be considered in light only of the appended claims and legal equivalents.

We claim:

1. A wavemeter for a high repetition rate gas discharge laser having a laser output beam comprising a pulsed output of greater than or equal to 15 mJ per pulse, sub-nanometer bandwidth tuning range pulses having a femptometer bandwidth precision and tens of femptometers bandwidth accuracy range, for measuring bandwidth on a pulse to pulse basis at pulse repetition rates of 4000Hz and above, comprising:

a focusing lens having a focal length;

an optical interferometer creating an interference fringe pattern;

an optical detector positioned at the focal length from the focusing lens;

a bandwidth calculator calculating bandwidth from the position of interference fringes in the interference fringe pattern incident on the optical detector, defining a $D_{ID}$ and a $D_{OD}$, the respective distances between a pair of first fringe borders and between a pair of second fringe borders in the interference fringe pattern on an axis of the interference pattern, and according to the formula $\Delta\lambda=\lambda_0[D_{OD}^2=D_{ID}^2]/[8f^2-D_0^2]$, where $\lambda_0$ is an assumed constant wavelength and $D_0=(D_{OD}-D_{ID})/2$, and f is the focal length.

2. The apparatus of claim 1 further comprising:
the optical detector is a photodiode array.

3. The apparatus of claim 1, further comprising:
the optical interferometer having a slit function;
the slit function and the focal length being selected to deliver to the optical detector the two innermost fringes of the optical interference fringe pattern.

4. The apparatus of claim 2, further comprising:
the optical interferometer having a slit function;
the slit function and the focal length being selected to deliver to the optical detector the two innermost fringes of the optical interference fringe pattern.

5. The apparatus of claim 1, further comprising:
the optical detector comprising an array of pixels each having a height and width and the array having a total width;
an aperture at the optical input to the optical interferometer selectively inputting to the optical interferometer a portion of a beam of light sufficient for the output of the optical interferometer to illuminate the optical detector over the height of each respective pixel.

6. The apparatus of claim 2, further comprising:
the optical detector comprising an array of pixels each having a height and width and the array having a total width;
an aperture at the optical input to the optical interferometer selectively inputting to the optical interferometer a portion of a beam of light sufficient for the output of the optical interferometer to illuminate the optical detector over the height of each respective pixel height.

7. The apparatus of claim 3, further comprising:
the optical detector comprising an array of pixels each having a height and width and the array having a total width;
an aperture at the optical input to the optical interferometer selectively inputting to the optical interferometer a portion of a beam of light sufficient for the output of the optical interferometer to illuminate the optical detector over the height of each respective pixel height.

8. The apparatus of claim 4, further comprising:
the optical detector comprising an array of pixels each having a height and width and the array having a total width;
an aperture at the optical input to the optical interferometer selectively inputting to the optical interferometer a portion of a beam of light sufficient for the output of the optical interferometer to illuminate the optical detector over the height of each respective pixel height.

9. The apparatus of claim 1 further comprising:
the optical interferometer is an etalon.

10. The apparatus of claim 2 further comprising:
the optical interferometer is an etalon.

11. The apparatus of claim 3 further comprising:
the optical interferometer is an etalon.

12. The apparatus of claim 4 further comprising:
the optical interferometer is an etalon.

13. The apparatus of claim 5 further comprising:
the optical interferometer is an etalon.

14. The apparatus of claim 6 further comprising:
the optical interferometer is an etalon.

15. The apparatus of claim 7 further comprising:
the optical interferometer is an etalon.

16. The apparatus of claim 8 further comprising:
the optical interferometer is an etalon.

17. The apparatus of claim 9 further comprising:
the etalon is an etalon having a slit function of 3 pm or less and a finesses of 25 or greater; and
the focal length is 1.5 meters.

18. The apparatus of claim 10 further comprising:
the etalon is an etalon having a slit function of 3 pm or less and a finesses of 25 or greater; and
the focal length is 1.5 meters.

19. The apparatus of claim 11 further comprising:
the etalon is an etalon having a slit function of 3 pm or less and a finesses of 25 or greater; and
the focal length is 1.5 meters.

20. The apparatus of claim 12 further comprising:
the etalon is an etalon having a slit function of 3 pm or less and a finesses of 25 or greater; and
the focal length is 1.5 meters.

21. The apparatus of claim 13 further comprising:
the etalon is an etalon having a slit function of 3 pm or less and a finesses of 25 or greater; and
the focal length is 1.5 meters.

22. The apparatus of claim 14 further comprising:
the etalon is an etalon having a slit function of 3 pm or less and a finesses of 25 or greater; and
the focal length is 1.5 meters.

23. The apparatus of claim 15 further comprising:
the etalon is an etalon having a slit function of 3 pm or less and a finesses of 25 or greater; and
the focal length is 1.5 meters.

24. The apparatus of claim 16 further comprising:
the etalon is an etalon having a slit function of 3 pm or less and a finesses of 25 or greater; and
the focal length is 1.5 meters.

25. The apparatus of claim 17 further comprising:
a first diffuser delivering a narrow cone of light to the etalon.

26. The apparatus of claim 18 further comprising:
a first diffuser delivering a narrow cone of light to the etalon.

27. The apparatus of claim 19 further comprising:
a first diffuser delivering a narrow cone of light to the etalon.

28. The apparatus of claim 20 further comprising:
a first diffuser delivering a narrow cone of light to the etalon.

29. The apparatus of claim 21 further comprising:
a first diffuser delivering a narrow cone of light to the etalon.

30. The apparatus of claim 22 further comprising:
a first diffuser delivering a narrow cone of light to the etalon.

31. The apparatus of claim 23 further comprising:
a first diffuser delivering a narrow cone of light to the etalon.

32. The apparatus of claim 24 further comprising:
a first diffuser delivering a narrow cone of light to the etalon.

33. The apparatus of claim 25 further comprising:
an aperture between the first diffuser and the etalon delivering to the etalon a thin strip of the narrow cone of light.

34. The apparatus of claim 26 further comprising:
an aperture between the first diffuser and the etalon delivering to the etalon a thin strip of the narrow cone of light.

35. The apparatus of claim 27 further comprising:
an aperture between the first diffuser and the etalon delivering to the etalon a thin strip of the narrow cone of light.

36. The apparatus of claim 28 further comprising:
an aperture between the first diffuser and the etalon delivering to the etalon a thin strip of the narrow cone of light.

37. The apparatus of claim 29 further comprising:
an aperture between the first diffuser and the etalon delivering to the etalon a thin strip of the narrow cone of light.

38. The apparatus of claim 30 further comprising:
an aperture between the first diffuser and the etalon delivering to the etalon a thin strip of the narrow cone of light.

39. The apparatus of claim 31 further comprising:
an aperture between the first diffuser and the etalon delivering to the etalon a thin strip of the narrow cone of light.

40. The apparatus of claim 32 further comprising:
an aperture between to the first stage diffuser and the etalon delivering to the etalon a thin strip of the narrow cone of light.

41. A wavemeter for a high repetition rate gas discharge laser having a laser output beam comprising a pulsed output of greater than or equal to 15 ml per pulse, sub-nanometer bandwidth tuning range pulses having a femptometer bandwidth precision and tens of femptometers bandwidths accuracy range, for measuring bandwidth on a pulse to pulse basis at pulse repetition rates of 4000Hz and above, comprising:
a focusing lens having a focal length;
an optical interference pattern generating means for creating an interference fringe pattern;
an optical detection means positioned at the focal length from the focusing lens;
a bandwidth calculating means for calculating bandwidth from the position of interference fringes in the interference fringe pattern incident on the optical detection means, defining a $D_{ID}$ and a $D_{OD}$, the respective distances between a pair of first fringe borders and between a pair of second fringe borders in the interference fringe pattern on an axis of the interference pattern, and according to the formula $\Delta\lambda=\lambda_0[D_{OD}^2-D_{ID}^2]/[8f^2-D_0^2]$, where $\lambda_0$ is an assumed constant wavelength and $D_0=(D_{OD}-D_{ID})/2$, and f is the focal length.

42. The apparatus of claim 41 further comprising:
the optical detection means is a photodiode array.

43. The apparatus of claim 41, further comprising:
the optical interference pattern generating means having a slit function;
the slit function and the focal length being selected to deliver to the optical detection means the two innermost fringes of the optical interference ring pattern.

44. The apparatus of claim 42, further comprising:
the optical interference pattern generating means having a slit function;
the slit function and the focal length being selected to deliver to the optical detector the two innermost fringes of the optical interference ring pattern.

45. The apparatus of claim 41, further comprising:
the optical detection means comprising an array of pixels each having a height and width and the array having a total width;
an aperture at the optical input to the optical interferometer selectively inputting to the optical interference pattern generating means a portion of a beam of light sufficient for the output of the interference pattern generating means to illuminate the optical detection means over the height of each respective pixel height and the total width.

46. The apparatus of claim 42, further comprising:
the optical detection means comprising an array of pixels each having a height and width and the array having a total width;
an aperture at the optical input to the optical interferometer selectively inputting to the optical interference pattern generating means a portion of a beam of light sufficient for the output of the interference pattern generating means to illuminate the optical detection over the height of each respective pixel height and the total width.

47. The apparatus of claim 43, further comprising:

the optical detection means comprising an array of pixels each having a height and width and the array having a total width;

an aperture at the optical input to the optical interferometer selectively inputting the optical interference pattern generating means a portion of a beam of light sufficient for the output of the interference pattern generating means to illuminate the optical detection means over the height of each respective pixel height and the total width.

48. The apparatus of claim 44, further comprising:

the optical detection means comprising an array of pixels each having a height and width and the array having a total width;

an aperture at the optical input to the optical interferometer selectively inputting to the optical interference pattern generating means a portion of a beam of light sufficient for the output of the interference pattern generating means to illuminate the optical detection means over the height of each respective pixel height and the total width.

49. The apparatus of claim 41 further comprising:

the optical interference pattern generating means is an etalon.

50. The apparatus of claim 42 further comprising:

the optical interference pattern generating means is an etalon.

51. The apparatus of claim 43 further comprising:

the optical interference pattern generating means is an etalon.

52. The apparatus of claim 44 further comprising:

the optical interference pattern generating means in an etalon.

53. The apparatus of claim 45 further comprising:

the optical interference pattern generating means is an etalon.

54. The apparatus of claim 46 further comprising:

the optical interference pattern generating means is an etalon.

55. The apparatus of claim 47 further comprising:

the optical interference pattern generating means is an etalon.

56. The apparatus of claim 48 further comprising:

the optical interference pattern generating means is an etalon.

57. The apparatus of claim 49 further comprising:

the etalon is an etalon having a slit function of 3 pm or less and a finesses of 25 or greater; and the focal length is 1.5 meters.

58. The apparatus of claim 50 further comprising:

the etalon is an etalon having a slit function of 3 pm or less and a finesses of 25 or greater; and the focal length is 1.5 meters.

59. The apparatus of claim 51 further comprising:

the etalon is an etalon having a slit function of 3 pm or less and a finesses of 25 or greater; and the focal length is 1.5 meters.

60. The apparatus of claim 52 further comprising:

the etalon is an etalon having a slit function of 3 pm or less and a finesses of 25 or greater; and the focal length is 1.5 meters.

61. The apparatus of claim 53 further comprising:

the etalon is an etalon having a slit function of 3 pm or less and a finesses of 25 or greater; and the focal length is 1.5 meters.

62. The apparatus of claim 54 further comprising:

the etalon is an etalon having a slit function of 3 pm or less and a finesses of 25 or greater; and the focal length is 1.5 meters.

63. The apparatus of claim 55 further comprising:

the etalon is an etalon having a slit function of 3 pm or less and a finesses of 25 or greater; and the focal length is 1.5 meters.

64. The apparatus of claim 56 further comprising:

the etalon is an etalon having a slit function of 3 pm or less and a finesses of 25 or greater; and the focal length is 1.5 meters.

65. The apparatus of claim 57 further comprising:

a first diffuser delivering a narrow cone of light to the etalon.

66. The apparatus of claim 58 further comprising:

a first diffuser delivering a narrow cone of light to the etalon.

67. The apparatus of claim 59 further comprising:

a first diffuser delivering a narrow cone of light to the etalon.

68. The apparatus of claim 60 further comprising:

a first diffuser delivering a narrow cone of light to the etalon.

69. The apparatus of claim 61 further comprising:

a first diffuser delivering a narrow cone of light to the etalon.

70. The apparatus of claim 62 further comprising:

a first diffuser delivering a narrow cone of light to the etalon.

71. The apparatus of claim 63 further comprising:

a first diffuser delivering a narrow cone of light to the etalon.

72. The apparatus of claim 64 further comprising:

a first diffuser delivering a narrow cone of light to the etalon.

73. The apparatus of claim 65 further comprising:

as aperture between the first diffuser and the etalon delivering on the etalon a thin strip of the narrow cone of light.

74. The apparatus of claim 66 further comprising:

an aperture between the first diffuser and the etalon delivering to the etalon a thin strip of the narrow cone of light.

75. The apparatus of claim 67 further comprising:

an aperture between the first diffuser and the etalon delivering to the etalon a thin strip of the narrow cone of light.

76. The apparatus of claim 68 further comprising:

an aperture between the first diffuser and the etalon delivering to the etalon a thin strip of the narrow cone of light.

77. The apparatus of claim 69 further comprising:

an aperture between the first diffuser and the etalon delivering to the etalon a thin strip of the narrow cone of light.

78. The apparatus of claim 70 further comprising:

an aperture between the first stage diffuser and the etalon delivering to the etalon a thin strip of the narrow cone of light.

79. The apparatus of claim 71 further comprising:
an aperture between the first diffuser and the etalon delivering to the etalon a thin strip of the narrow cone of light.

80. The apparatus of claim 72 further comprising:
an aperture between the first diffuser and the etalon delivering to the etalon a thin strip of the narrow cone of light.

81. A method of measuring bandwidth of light produced by a high repetition rate gas discharge laser having a laser output beam comprising a pulsed output of greater than or equal to 15 ml per pulse, sub-nanometer bandwidth tuning range pulses having a femptometer bandwidth precision and tens of femptometers bandwidth accuracy range, for measuring bandwidth on a pulse to pulse basis at pulse repetition rates of 4000Hz, and above, comprising:
focusing the light in a lens having a focal length;
creating an interference fringe pattern;
detecting the interference fringe pattern in an optical detector positioned at the focal length from the lens;
calculating bandwidth from the position of interference fringes in the interference fringe pattern incident on the optical detector, defining a $D_{ID}$ and a $D_{ON}$, the respective distances between a pair of first fringe borders and between a pair of second fringe borders in the interference fringe pattern on an axis of the interference fringe pattern, and according to the formula $\Delta\lambda=\lambda_0 [D_{OD}^2-D_{ID}^2]/[8f^2-D_0^2]$, where $\lambda_0$ is an assumed constant wavelength and $D_0=(D_{OD}-D_{ID})/2$, and f is the focal length.

82. The method of claim 81 further comprising:
the optical detector is a photodiode array.

83. The method of claim 81, further comprising:
creating the interference pattern in an optical interferometer having a slit function;
the slit function and the focal length being selected to deliver to the optical detection means the two innermost fringes of the optical interference ring pattern.

84. The method of claim 82, further comprising:
creating the interference pattern in an optical interferometer having a slit function;
the slit function and the focal length being selected to deliver to the optical detector the two innermost fringes of the optical interference ring pattern.

85. The method of claim 81, further comprising:
the optical detector comprising an array of pixels each having a height and width and the array having a total width;
creating the interference fringe pattern in an optical interferometer;
selectively inputting to the optical interferometer a slit portion of a beam of light sufficient for the output of the optical interferometer to illuminate the optical detection means over the height of each respective pixel height.

86. The method of claim 82, further comprising:
the optical detector comprising an array of pixels each having a height and width and the array having a total width;
creating the interference fringe pattern in an optical interferometer;
selectively inputting to the optical interferometer a slit portion of a beam of light sufficient for the output of the optical interferometer to illuminate the optical detection over the height of each respective pixel height.

87. The method of claim 83, further comprising:
the optical detector comprising an array of pixels each having a height and width and the array having a total width;
selectively inputting to the optical interferometer a slit portion of a beam of light sufficient for the output of the optical interferometer to illuminate the optical detection means over the height of each respective pixel height.

88. The method of claim 84, further comprising:
the optical detector comprising an array of pixels each having a height and width and the array having a total width;
selectively inputting to the optical interferometer a slit portion of a beam of light sufficient for the output of the optical interferometer to illuminate the optical detection means over the height of each respective pixel height.

89. The method of claim 81 further comprising:
creating the interference pattern in an etalon having a slit function.

90. The method of claim 82 further comprising:
creating the interference pattern in an etalon having a slit function.

91. The method of claim 83 further comprising:
the optical interferometer is an etalon.

92. The method of claim 84 further comprising:
the optical interferometer is an etalon.

93. The method of claim 85 further comprising:
the optical interferometer is an etalon.

94. The method of claim 86 further comprising:
the optical interferometer is an etalon.

95. The method of claim 87 further comprising:
the optical interferometer is an etalon.

96. The method of claim 88 further comprising:
the optical interferometer is an etalon.

97. The method of claim 89 further comprising:
the etalon is an etalon having a slit function of 3 pm or less and a finesses of 25 or greater; and
the focal length is 1.5 meters.

98. The method of claim 90 further comprising:
the etalon is an etalon having a slit function of 3 pm or less and a finesses of 25 or greater; and
the focal length is 1.5 meters.

99. The method of claim 91 further comprising:
the etalon is an etalon having a slit function of 3 pm or less and a finesses of 25 or greater; and
the focal length is 1.5 meters.

100. The method of claim 92 further comprising:
the etalon is an etalon having a slit function of 3 pm or less and a finesses of 25 or greater; and
the focal length is 1.5 meters.

101. The method of claim 93 further comprising:
the etalon is an etalon having a slit function of 3 pm or less and a finesses of 25 or greater; and
the focal length is 1.5 meters.

102. The method of claim 94 further comprising:
the etalon is an etalon having a slit function of 3 pm or less and a finesses of 25 or greater; and
the focal length is 1.5 meters.

103. The method of claim 95 further comprising:
the etalon is an etalon having a slit function of 3 pm or less and a finesses of 25 or greater; and
the focal length is 1.5 meters.

104. The method of claim 96 further comprising:
the etalon is an etalon having a slit function of 3 pm or less and a finesses of 25 or greater; and
the focal length is 1.5 meters.

105. The method of claim 97 further comprising:
delivering a narrow cone of diffused light of the etalon.

106. The method of claim 98 further comprising:
delivering a narrow cone of diffused light to the etalon.

107. The method of claim 99 further comprising:
delivering a narrow cone of diffused light to the etalon.

108. The method of claim 100 further comprising:
delivering a narrow cone of diffused light to the etalon.

109. The method of claim 101 further comprising:
delivering a narrow cone of diffused light to the etalon.

110. The method of claim 102 further comprising:
delivering a narrow cone of diffused light to the etalon.

111. The method of claim 103 further comprising:
delivering a narrow cone of diffused light to the etalon.

112. The method of claim 104 further comprising:
delivering a narrow cone of diffused light to the etalon.

113. The apparatus of claim 105 further comprising:
passing the narrow cone of light through a slit aperture.

114. The apparatus of claim 106 further comprising:
passing the narrow cone of light through a slit aperture.

115. The apparatus of claim 107 further comprising:
passing the narrow cone of light through a slit aperture.

116. The apparatus of claim 108 further comprising:
passing the narrow cone of light through a slit aperture.

117. The apparatus of claim 109 further comprising:
passing the narrow cone of light through a slit aperture.

118. The apparatus of claim 110 further comprising:
passing the narrow cone of light through a slit aperture.

119. The apparatus of claim 111 further comprising:
passing the narrow cone of light through a slit aperture.

120. The apparatus of claim 112 further comprising:
passing the narrow cone of light through a slit aperture.

121. The apparatus of claim 33 further comprising:
a beam narrower in the path of the beam before the optical interferometer;
a second diffuser between the beam narrower and the optical interferometer;
the beam narrower narrowing the beam more in a first axis than in a second axis to conform the beam cross section to the shape of the second diffuser.

122. The apparatus of claim 34 further comprising:
a beam narrower in the path of the beam before the optical interferometer;
a second diffuser between the beam narrower and the optical interferometer;
the beam narrower narrowing the beam more in a first axis than in a second axis to conform the beam cross section to the shape of the second diffuser.

123. The apparatus of claim 35 further comprising:
a beam narrower in the path of the beam before the optical interferometer;
a second diffuser between the beam narrower and the optical interferometer;
the beam narrower narrowing the beam more in a first axis than in a second axis to conform the beam cross section to the shape of the second diffuser.

124. The apparatus of claim 36 further comprising:
a beam narrower in the path of the beam before the optical interferometer;
a second diffuser between the beam narrower and the optical interferometer;
the beam narrower narrowing the beam more in a first axis than in a second axis to conform the beam cross section to the shape of the second diffuser.

125. The apparatus of claim 37 further comprising:
a beam narrower in the path of the beam before the optical interferometer;
a second diffuser between the beam narrower and the optical interferometer;
the beam narrower narrowing the beam more in a first axis in a second axis to conform the beam cross section to the shape of the second diffuser.

126. The apparatus of claim 38 further comprising:
a beam narrower in the path of the beam before the optical interferometer;
a second diffuser between the beam narrower and the optical interferometer;
the beam narrower narrowing the beam more in a first axis than in a second axis to conform the beam cross section to the shape of the second diffuser.

127. The apparatus of claim 39 further comprising:
a beam narrower in the path of the beam before the optical interferometer;
a second diffuser between the beam narrower and the optical interferometer;
the beam narrower narrowing the beam more in a first axis than in a second axis to conform the beam cross section to the shape of the second diffuser.

128. The apparatus of claim 40 further comprising:
a beam narrower in the path of the beam before the optical interferometer;
a second diffuser between the beam narrower and the optical interferometer;
the beam narrower narrowing the beam more in a first axis than in a second axis to conform the beam cross section to the shape of the second diffuser.

129. The apparatus of claim 73 further comprising:
a beam narrowing means in the path of the beam before the optical interferometer;
a second diffuser between the beam narrowing means and the optical interferometer;
the beam narrowing means narrowing the beam more in a first axis than in a second axis to conform the beam cross section to the shape of the second diffuser.

130. The apparatus of claim 74 further comprising:
a beam narrowing means in the path of the beam before the optical interferometer;
a second diffuser between the beam narrowing means and the optical interferometer;
the beam narrowing means narrowing the beam more in a first axis than in a second axis to conform the beam cross section to the shape of the second diffuser.

131. The apparatus of claim 75 further comprising:
a beam narrowing means in the path of the beam before the optical interferometer;
a second diffuser between the beam narrowing means and the optical interferometer;
the beam narrowing means narrowing the beam more in a first axis than in a second axis to conform the beam cross section to the shape of the second diffuser.

132. The apparatus of claim 76 further comprising:
a beam narrowing means in the path of the beam before the optical interferometer;

a second diffuser between the beam narrowing means and the optical interferometer;

the beam narrowing means narrowing the beam more in a first axis than in a second axis to conform the beam cross section to the shape of the second diffuser.

133. The apparatus of claim 77 further comprising:

a beam narrowing means in the path of the beam before the optical interferometer;

a second diffuser between the beam narrowing means and the optical interferometer;

the beam narrowing means narrowing the beam more in a first axis than in a second axis to conform the beam cross section to the shape of the second diffuser.

134. The apparatus of claim 78 further comprising:

a beam narrowing means in the path of the beam before the optical interferometer;

a second diffuser between the beam narrowing means and the optical interferometer;

the beam narrowing means narrowing the beam more in a first axis than in a second axis to conform the beam cross section to the shape of the second diffuser.

135. The apparatus of claim 79 further comprising:

a beam narrowing means in the path of the beam before the optical interferometer;

a second diffuser between the beam narrowing means and the optical interferometer;

the beam narrowing means narrowing the beam more in a first axis than in a second axis to conform the beam cross section to the shape of the second diffuser.

136. The apparatus of claim 80 further comprising:

a beam narrowing means in the path of the beam before the optical interferometer;

a second diffuser between the beam narrowing means and the optical interferometer;

the beam narrowing means narrowing the beam more in a first axis than in a second axis to conform the beam cross section to the shape of the second diffuser.

137. The method of claim 113 further comprising:

narrowing the beam before creating the interference pattern;

diffusing the narrowed beam in a second diffuser;

narrowing the beam more in a first axis than in a second axis to conform the beam cross section to the shape of the second diffuser.

138. The method of claim 114 further comprising:

narrowing the beam before creating the interference pattern;

diffusing the narrowed beam in a second diffuser;

narrowing the beam more in a first axis than in a second axis to conform the beam cross section to the shape of the second diffuser.

139. The method of claim 115 further comprising:

narrowing the beam before creating the interference pattern;

diffusing the narrowed beam in a second diffuser;

narrowing the beam more in a first axis than in a second axis to conform the beam cross section to the shape of the diffuser.

140. The method of claim 116 further comprising:

narrowing the beam before creating the interference pattern;

diffusing the narrowed beam in a diffuser;

narrowing the beam more in a first axis than in a second axis to conform the beam cross section to the shape of the second diffuser.

141. The method of claim 117 further comprising:

narrowing the beam before creating the interference pattern;

diffusing the narrowed beam in a second diffuser;

narrowing the beam more in a first axis than in a second axis to conform the beam cross section to the shape of the second diffuser.

142. The method of claim 118 further comprising:

narrowing the beam before creating the interference pattern;

diffusing the narrowed beam in a second diffuser;

narrowing the beam more in a first axis than in a second axis to conform the beam cross section to the shape of the second diffuser.

143. The method of claim 119 further comprising:

narrowing the beam before creating the interference pattern;

diffusing the narrowed beam in a second diffuser;

narrowing the beam more in a first axis than in a second axis to conform the beam cross section to the shape of the second diffuser.

144. The method of claim 120 further comprising:

narrowing the beam before creating the interference pattern;

diffusing the narrowed beam in a second diffuser;

narrowing the beam more in a first axis than in a second axis to conform the beam cross section to the shape of the second diffuser.

145. The apparatus of claim 25 further comprising:

the first diffuser comprises an etched ground glass diffuser delivering a cone angle of less than fifteen degrees.

146. The apparatus of claim 26 further comprising:

the first diffuser comprises an etched ground glass diffuser delivering a cone angle of less than fifteen degrees.

147. The apparatus of claim 27 further comprising:

the first diffuser comprises an etched ground glass diffuser delivering a cone angle of less than fifteen degrees.

148. The apparatus of claim 28 further comprising:

the first diffuser comprises an etched ground glass diffuser delivering a cone angle of less than fifteen degrees.

149. The apparatus of claim 29 further comprising:

the first diffuser comprises an etched ground glass diffuser delivering a cone angle of less than fifteen degrees.

150. The apparatus of claim 30 further comprising:

the first diffuser comprises an etched ground glass diffuser delivering a cone angle of less than fifteen degrees.

151. The apparatus of claim 31 further comprising:

the first diffuser comprises an etched ground glass diffuser delivering a cone angle of less than fifteen degrees.

152. The apparatus of claim 32 further comprising:

the first diffuser comprises an etched ground glass diffuser delivering a cone angle of less than fifteen degrees.

* * * * *